United States Patent
Adachi

(10) Patent No.: US 10,707,399 B2
(45) Date of Patent: Jul. 7, 2020

(54) THERMOELECTRIC MATERIAL, THERMOELECTRIC ELEMENT, OPTICAL SENSOR, AND METHOD OF MANUFACTURING THERMOELECTRIC MATERIAL

(71) Applicant: Sumitomo Electric Industries, Ltd., Osaka-shi (JP)

(72) Inventor: Masahiro Adachi, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 75 days.

(21) Appl. No.: 16/098,896

(22) PCT Filed: Feb. 13, 2017

(86) PCT No.: PCT/JP2017/005131
§ 371 (c)(1),
(2) Date: Nov. 5, 2018

(87) PCT Pub. No.: WO2017/208505
PCT Pub. Date: Dec. 7, 2017

(65) Prior Publication Data
US 2019/0198742 A1    Jun. 27, 2019

(30) Foreign Application Priority Data

Jun. 1, 2016    (JP) .................. 2016-109968

(51) Int. Cl.
*H01L 35/00* (2006.01)
*H01L 35/26* (2006.01)
(Continued)

(52) U.S. Cl.
CPC .............. *H01L 35/26* (2013.01); *B82Y 30/00* (2013.01); *C01B 33/06* (2013.01); *G01J 1/02* (2013.01);
(Continued)

(58) Field of Classification Search
CPC combination set(s) only.
See application file for complete search history.

(56) References Cited

U.S. PATENT DOCUMENTS

2008/0257395 A1* 10/2008 Jovanovic ............. H01L 29/155
136/239
2016/0300994 A1    10/2016 Adachi et al.

FOREIGN PATENT DOCUMENTS

JP    2002-076452 A    3/2002
WO    2015/093207 A1    6/2015

OTHER PUBLICATIONS

Hicks et al., "Effect of quantum-well structures on the thermoelectric figure of merit," Physical Review B, The American Physical Society, vol. 47, No. 19, 1993, pp. 12727-12731.
(Continued)

*Primary Examiner* — Don K Wong
(74) *Attorney, Agent, or Firm* — Baker Botts L.L.P.; Michael A. Sartori

(57) ABSTRACT

Better thermoelectric characteristics of a thermoelectric material containing nanoparticles are achieved. The thermoelectric material contains a plurality of nanoparticles distributed in a mixture of a first material having a band gap and a second material different from the first material. The first material contains Si and Ge. A concentration of atoms of the second material and a composition ratio of Si to Ge satisfy relational expressions in expressions (1) and (2) below with c representing a concentration of atoms (unit of atomic %) of the second material in the thermoelectric material and r representing the composition ratio of Si to Ge:

$r \leq 0.62c - 0.25$    (1)

$r \geq 0.05c - 0.06$    (2).

16 Claims, 23 Drawing Sheets

(51) Int. Cl.
*H01L 35/32* (2006.01)
*H01L 35/34* (2006.01)
*B82Y 30/00* (2011.01)
*C01B 33/06* (2006.01)
*H02N 11/00* (2006.01)
*H01L 21/205* (2006.01)
*G01J 1/02* (2006.01)
*H01L 35/14* (2006.01)
*G01J 5/12* (2006.01)
*H01L 35/22* (2006.01)

(52) U.S. Cl.
CPC .............. *G01J 5/12* (2013.01); *H01L 21/205* (2013.01); *H01L 35/14* (2013.01); *H01L 35/22* (2013.01); *H01L 35/32* (2013.01); *H01L 35/34* (2013.01); *H02N 11/00* (2013.01)

(56) References Cited

OTHER PUBLICATIONS

Hicks et al., "Thermoelectric figure of merit of a one-dimensional conductor," Physical Review B, The American Physical Society, vol. 47, No. 24, 1993, pp. 16631-16634.

Hicks et al., "Experimental study of the effect of quantum-well structures on the thermoelectric figure of merit," Physical Review B, The American Physical Society, vol. 53, No. 16, 1996, pp. R10493-10496.

Takiguchi et al., "Nano Structural and Thermoelectric Properties of SiGeAu Thin Films," Japanese Journal of Applied Physics, vol. 50, 2011, pp. 041301-01 to 041301-05.

\* cited by examiner

φ : PARTICLE SIZE
d : INTERPARTICLE DISTANCE

THERMOELECTRIC MATERIAL, THERMOELECTRIC ELEMENT, OPTICAL SENSOR, AND METHOD OF MANUFACTURING THERMOELECTRIC MATERIAL

TECHNICAL FIELD

This invention relates to a thermoelectric material, a thermoelectric element, an optical sensor, and a method of manufacturing a thermoelectric material.

The present application claims priority to Japanese Patent Application No. 2016-109968 filed on Jun. 1, 2016 and incorporates by reference the entire description in the Japanese application.

BACKGROUND ART

It has recently been known (for example, L. D. Hicks et al., PRB 47 (1993) 12727 (NPL 1) and L. D. Hicks et al., PRB 47 (1993) 16631 (NPL 2)) or demonstrated (for example, L. D. Hicks et al., PRB 53 (1996) R10493 (NPL 3)) that Seebeck coefficient S and thermal conductivity K can be controlled by lowering a dimension of carriers (free electrons or free holes) and increasing phonon scattering owing to quantum wells and quantum wires.

A thermoelectric material in which carriers have further been lowered in dimension by forming particles has been known (Japanese Patent Laying-Open No. 2002-076452 (PTL 1)).

Furthermore, it has been reported as another example of a lower dimension of carriers (H. Takiguchi et al., JJAP 50 (2011) 041301 (NPL 4)) that by forming nanoparticles of SiGe in a thin film of silicon germanium gold (SiGeAu) by annealing the thin film, thermoelectric characteristics are improved as compared with bulk SiGe.

CITATION LIST

Patent Literature

PTL 1: Japanese Patent Laying-Open No. 2002-076452

Non Patent Literature

NPL 1: L. D. Hicks et al., PRB 47 (1993) 12727
NPL 2: L. D. Hicks et al., PRB 47 (1993) 16631
NPL 3: L. D. Hicks et al., PRB 53 (1996) R10493
NPL 4: H. Takiguchi et al., JJAP 50 (2011) 041301

SUMMARY OF INVENTION

A thermoelectric material in the present disclosure includes a first material containing Si and Ge and a second material different from the first material. The thermoelectric material includes a plurality of nanoparticles distributed in a mixture of the first material and the second material. A concentration of atoms c of the second material and a composition ratio r satisfy relational expressions in expressions (I) and (II) below with c representing a concentration of atoms (unit of atomic %) of the second material in the thermoelectric material and r representing a composition ratio of Si to Ge:

$$r \leq 0.62c - 0.25 \quad (I)$$

$$r \geq 0.05c - 0.06 \quad (II)$$

A method of manufacturing a thermoelectric material in the present disclosure includes alternately stacking a first layer composed of Ge and containing the second material and a second layer composed of Si and not containing the second material. Concentration of atoms c of the second material and composition ratio r satisfy relational expressions in the expressions (I) and (II) with c representing a concentration of atoms (unit of atomic %) of the second material in the thermoelectric material and r representing a composition ratio (Si/Ge) of Si to Ge.

DETAILED DESCRIPTION

Figure 1:
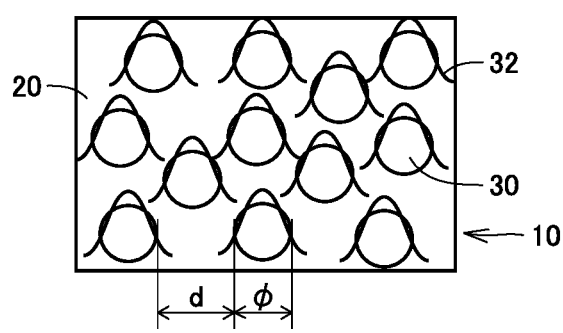
FIG. 1 is a schematic diagram showing a construction of a thermoelectric material according to a first embodiment.

Problem to be Solved by the Present Disclosure

A thermoelectric material converts a temperature difference (thermal energy) into electric energy, and conversion efficiency η thereof is expressed in an expression (1) below.

$$\eta = \frac{\Delta T}{Th} \frac{M-1}{M + \frac{Tc}{Th}} \quad (1)$$

In the expression (1), Th represents a temperature on a high-temperature side, Tc represents a temperature on a low-temperature side, and ΔT represents a temperature difference between Th and Tc (=Th−Tc). M is given in an expression (2) below, using a dimensionless performance index ZT representing an index representing performance of a thermoelectric material. This dimensionless performance index ZT is a value obtained by multiplying a performance index Z by an absolute temperature T, and expressed in an expression (3) below.

$$M = \sqrt{1 + ZT} \quad (2)$$

$$ZT = \frac{S^2 \sigma T}{\kappa} \quad (3)$$

In the expression (3), S represents a Seebeck coefficient (V/K) of a thermoelectric material, σ represents a conductivity (S/m) of a thermoelectric material, and κ represents a thermal conductivity (W/mK) of a thermoelectric material. Z has a dimension defined by a reciprocal of a temperature, and ZT obtained by multiplying this performance index Z by absolute temperature T has a dimensionless value.

Conversion efficiency η given in the expression (1) is a monotonically increasing function of dimensionless performance index ZT. Therefore, increase in dimensionless performance index ZT is a key for improvement in performance. Conventionally, however, dimensionless performance index ZT has remained around 1, and a result exceeding this has not been reported.

The present inventor has conducted dedicated studies about the methods described in NPLs 1 to 3, and found that when a thermoelectric material contains quantum dots having a particle size and an interparticle distance which do not achieve a quantum effect, a sufficient quantum effect, that is, quantal increase in density of states, has not been obtained. Therefore, a Seebeck coefficient has not sufficiently been improved.

In the method described in NPL 4, phonon scattering can be improved and thermal conductivity can be lowered by formed nanoparticles, however, a Seebeck coefficient has not sufficiently been improved. A factor therefor may be that, in NPL 4, though a size of nanoparticles can be controlled, an interval between nanoparticles cannot be controlled. Therefore, wave functions cannot be combined between nanoparticles and hence a conductivity is low.

This invention was made to solve such problems, and an object of this invention is to achieve better thermoelectric characteristics of a thermoelectric material containing nanoparticles.

Effect of the Present Disclosure

According to the present disclosure, better thermoelectric characteristics of a thermoelectric material containing nanoparticles can be achieved.

DESCRIPTION OF EMBODIMENTS OF THE PRESENT INVENTION

Embodiments of the present invention will initially be listed and described.

(1) A thermoelectric material according to one manner of the present invention includes a first material containing Si and Ge and a second material different from the first material. The thermoelectric material includes a plurality of nanoparticles distributed in a mixture of the first material and the second material. A concentration of atoms c of the second material and a composition ratio r satisfy relational expressions in expressions (I) and (II) below with c representing a concentration of atoms (unit of atomic %) of the second material in the thermoelectric material and r representing a composition ratio of Si to Ge:

$$r \leq 0.62c - 0.25 \quad (I)$$

$$r \geq 0.05c - 0.06 \quad (II).$$

Thus, the thermoelectric material has a quantum network (net) structure in which the nanoparticles having a particle size not greater than 5 nm are distributed in the mixture at an interparticle distance not greater than 2 nm. The nanoparticles herein are defined as crystal grains of a nanometer order which are composed of periodically arranged atoms and can partially be regarded as a single crystal. The nanoparticles contain at least a first material. Some of the nanoparticles contain the first material and some of the nanoparticles contain the first material and the second material. When nanoparticles are three-dimensionally surrounded by a sufficiently thick and high energy barrier layer, they become quantum dots. The particle size herein refers to a longer diameter of nanoparticles measured in an image obtained with an electron microscope (a two-dimensional plane projection image). The interparticle distance refers to a shortest distance from an end to an end of nanoparticles measured in an image obtained with an electron microscope (a two-dimensional plane projection image).

According to the present embodiment, since a direction of quantization in the quantum net structure is the same as a direction of carrier transport in the thermoelectric material, a quantum effect can be taken into control of a conductivity and a Seebeck coefficient. The direction of carrier transport means a direction of migration of carriers due to a temperature difference caused in the thermoelectric material.

In the quantum net structure, a particle size of the nanoparticles corresponds to a width of the quantum dots in the direction of carrier transport and an interparticle distance between nanoparticles corresponds to a distance between quantum dots in the direction of carrier transport. The present inventor has studied an optimal structure which can exhibit a quantum effect, and consequently found that the quantum effect is effectively exhibited and excellent thermoelectric characteristics can be achieved in a structure in which nanoparticles have a particle size not greater than 5 nm and a distance in the direction of carrier transport between two adjacent nanoparticles is not greater than 2 nm. In order to express the quantum effect, the nanoparticles should have a particle size not smaller than 0.1 nm. Since the quantum effect is not expressed if two nanoparticles are in contact with each other, the two nanoparticles should be distant from each other by 0.1 nm or greater.

The present inventor has further found that the structure can be realized by controlling a composition (a concentration of atoms) of the second material in the thermoelectric material and a composition ratio of elements contained in the first material. Specifically, the present inventor has found that the structure can be realized by concentration of atoms c of the second material and composition ratio (Si/Ge) r of Si to Ge satisfying the relational expressions in the expressions (I) and (II) in an example where the first material contains Si and Ge.

(2) In the thermoelectric material according to (1), preferably, concentration of atoms c of the second material and composition ratio r further satisfy a relational expression in an expression (III) below:

$$r \geq 0.23c + 0.3 \tag{III}$$

By doing so, the thermoelectric material has the quantum net structure in which nanoparticles having a particle size not greater than 3 nm are distributed in the mixture at an interparticle distance not greater than 2 nm. Since the thermoelectric material thus exhibits the noticeable quantum effect, excellent thermoelectric characteristics can be achieved.

(3) In the thermoelectric material according to (1) or (2), preferably, composition ratio r is not lower than 0.16.

Thus, in the quantum net structure in which nanoparticles of SiGe are distributed in a base material containing amorphous SiGe, an energy difference ΔE between a band gap of the base material and a quantum level can be set to magnitude necessary for expressing a carrier confinement effect (that is, ΔE≥0.03 eV).

(4) In the thermoelectric material according to (3), preferably, composition ratio r is not lower than 0.3. Energy difference ΔE can thus be not lower than 0.1 eV. When energy difference ΔE is not lower than 0.1 eV, the carrier confinement effect is effectively exhibited and hence good thermoelectric characteristics are achieved.

(5) In the thermoelectric material according to (4), preferably, composition ratio r is not lower than 0.56. Since energy difference ΔE is thus not lower than 0.2 eV, the carrier confinement effect is noticeable. Therefore, thermoelectric characteristics can further be improved.

(6) In the thermoelectric material according to any of (1) to (5), preferably, the second material is defined as Au, Cu, B, or Al. Thus, a thermoelectric material in which nanoparticles of SiGe containing Au, Cu, B, or Al are distributed in a base material which is a mixture of the first material composed of Si and Ge (amorphous SiGe, amorphous Ge, or amorphous Si) and the second material composed of Au, Cu, B, or Al is formed.

(7) A thermoelectric element according to one manner of the present invention includes the thermoelectric material according to any of (1) to (6) which is doped to a p-type or an n-type and a pair of electrodes joined to a first end surface of the thermoelectric material and a second end surface opposed to the first end surface. A thermoelectric element having excellent thermoelectric characteristics can thus be realized.

(8) A thermoelectric element according to one manner of the present invention includes the thermoelectric material according to any of (1) to (6) which is doped to a p-type or an n-type and a pair of electrodes arranged such that the electrodes are spaced apart from each other on an identical main surface of the thermoelectric material and joined to the thermoelectric material. A thermoelectric element having excellent thermoelectric characteristics can thus be realized.

(9) A thermoelectric element according to one manner of the present invention includes a first thermoelectric material doped to a p-type and a second thermoelectric material doped to an n-type. The first thermoelectric material and the second thermoelectric material are composed of the thermoelectric material according to any of (1) to (6). The first thermoelectric material and the second thermoelectric material each have a first end surface and a second end surface located opposite to the first end surface, and the first thermoelectric material and the second thermoelectric material are joined to each other at the first end surfaces. The thermoelectric element further includes a pair of electrodes joined to the second end surface of the first thermoelectric material and the second end surface of the second thermoelectric material. A thermoelectric element having excellent thermoelectric characteristics can thus be realized.

(10) An optical sensor according to one manner of the present invention includes an absorber which absorbs light and converts light to heat and a thermoelectric conversion portion connected to the absorber. The thermoelectric conversion portion includes the thermoelectric material according to any of (1) to (6), which is doped to a p-type or an n-type. Thus, an optical sensor high in performance can be realized by including a thermoelectric material having excellent thermoelectric characteristics.

(11) A method of manufacturing a thermoelectric material according to one manner of the present invention is a method of manufacturing a thermoelectric material including a plurality of nanoparticles distributed in a mixture of a first material and a second material, the first material containing Si and Ge, the second material being different from the first material. The method of manufacturing a thermoelectric material includes alternately stacking a first layer containing Ge and the second material and a second layer containing Si and not containing the second material. Concentration of atoms c of the second material and composition ratio r satisfy relational expressions in expressions (I) and (II) below with c representing a concentration of atoms (unit of atomic %) of the second material in the thermoelectric material and r representing a composition ratio of Si to Ge:

$$r \leq 0.62c - 0.25 \tag{I}$$

$$r \geq 0.05c - 0.06 \tag{II}$$

According to the manufacturing method, a thermoelectric material having a quantum net structure in which nanoparticles having a particle size not greater than 5 nm are distributed in a mixture at an interparticle distance not greater than 2 nm can be manufactured. Since the thermoelectric material effectively exhibits a quantum effect in the quantum net structure, excellent thermoelectric characteristics can be realized.

According to the manufacturing method, a particle size of and an interparticle distance between the nanoparticles in the quantum net structure can be controlled based on a composition (concentration of atoms c) of the second material in the thermoelectric material and composition ratio (Si/Ge) r of elements contained in the first material. The concentration of atoms of the second material in the thermoelectric material can be adjusted based on the concentration of atoms of the second material contained in the first layer and the number of times of stacking the first layer in the stacking step. The composition ratio Si/Ge of elements contained in the first material can be adjusted based on a thickness of the first layer and a thickness of the second layer in the stacking step.

(12) In the method of manufacturing a thermoelectric material according to (11), preferably, concentration of atoms c of the second material and composition ratio r in the thermoelectric material further satisfy a relational expression in an expression (III) below:

$$r \geq 0.23c + 0.3 \quad (III).$$

By doing so, the thermoelectric material having the quantum net structure in which nanoparticles having a particle size not greater than 3 nm are distributed in the mixture at an interparticle distance not greater than 2 nm can be manufactured. Since the quantum effect is thus noticeable, the thermoelectric material can achieve excellent thermoelectric characteristics.

(13) In the method of manufacturing a thermoelectric material according to (11) or (12), preferably, the method further includes forming the plurality of nanoparticles in the mixture by annealing a stack obtained by stacking the first layer and the second layer. Since the nanoparticles formed through annealing treatment thus have a particle size not greater than 5 nm and a distance in the direction of carrier transport between two adjacent nanoparticles is not greater than 2 nm, the quantum effect is effectively exhibited in the quantum net structure. Consequently, the thermoelectric material can achieve excellent thermoelectric characteristics.

(14) In the method of manufacturing a thermoelectric material according to (13), preferably, a temperature for the annealing treatment is not lower than 300° C. and not higher than 800° C. Thus, the nanoparticles having an average particle size not greater than 5 nm and an average interparticle distance not greater than 2 nm can be formed through the annealing treatment. The average particle size herein refers to an arithmetic mean of particle sizes of a sufficient number of particles. An arithmetic mean of particle sizes of 22 particles is herein calculated as the average particle size. The average interparticle distance refers to an arithmetic mean of intervals among a sufficient number of nanoparticles. An arithmetic mean of intervals among 22 nanoparticles is herein calculated as the average interval.

(15) In the method of manufacturing a thermoelectric material according to (11) to (14), composition ratio r is not lower than 0.16, more preferably not lower than 0.3, and further preferably not lower than 0.56. Since the carrier confinement effect is thus effectively exhibited in the quantum net structure, good thermoelectric characteristics are achieved.

(16) In the method of manufacturing a thermoelectric material according to (11) to (15), preferably, the second material is defined as Au, Cu, B, or Al.

DETAILS OF EMBODIMENT OF THE PRESENT INVENTION

An embodiment of the present invention will be described hereinafter with reference to the drawings. In the drawings below, the same or corresponding elements have the same reference characters allotted and description thereof will not be repeated.

First Embodiment

1. Construction of Thermoelectric Material

A basic construction of a thermoelectric material according to a first embodiment will initially be described. FIG. 1 is a diagram schematically showing a thermoelectric material 10 having a quantum dot structure.

Quantum dots refer to nanoparticles of a semiconductor of which particle size is as small as approximately several nanometers. When nanoparticles are three-dimensionally surrounded by a sufficiently thick and high energy barrier layer, they become quantum dots.

In this embodiment, a direction of quantization in the quantum dot structure is matched with a direction of carrier transport in the thermoelectric material. The direction of carrier transport means a direction of migration of carriers due to a temperature difference caused in the thermoelectric material. When the quantum dot structure is quantized with respect to the direction of carrier transport, the quantum effect, that is, quantal increase in density of states, can be taken into control of a conductivity σ and a Seebeck coefficient S of a thermoelectric material.

Specifically, in the quantum dot structure, conductivity σ and Seebeck coefficient S can be calculated with expressions (4) and (5) below.

$$\sigma(T) = \int_{-\infty}^{\infty} \frac{q^2}{3} v^2(\varepsilon)\tau(\varepsilon)N(\varepsilon)\left(-\frac{\partial f(\varepsilon, T)}{\partial \varepsilon}\right)d\varepsilon \quad (4)$$

$$S(T) = \frac{1}{qT} \frac{\int_{-\infty}^{\infty} \frac{q^2}{3} v^2(\varepsilon)\tau(\varepsilon)N(\varepsilon)(\varepsilon - \varepsilon f)\left(-\frac{\partial f(\varepsilon, T)}{\partial \varepsilon}\right)d\varepsilon}{\sigma(T)} \quad (5)$$

In the expressions (4) and (5), q represents elementary charge (C), v represents a heat speed (m/s) of carriers, τ represents a relaxation time (s) of carriers, N represents density of states ($m^{-3}$), ε represents energy of carriers, εf represents Fermi energy, and f(ε, T) represents a Fermi distribution function.

When the quantum dot structure is quantized with respect to the direction of carrier transport, with increase in energy level of electrons, density of states increases. The density of states in the quantized state can be taken into the expressions (4) and (5).

In a case of ideal quantum dots, a carrier heat speed v=0 is achieved in the expression (4), and hence conductivity σ=0 is achieved, which is not suited for a thermoelectric material.

In the present embodiment, wave functions of carriers are combined between quantum dots by decreasing an interval between quantum dots (nanoparticles). A quantum dot structure is a structure in which a state that an electron state around a valence band and a conduction band is quantized in a three-dimensional direction and an energy level is discretized is obtained. The quantum dot structure can have discrete sub band structures not only in a z direction but also in an x direction and a y direction, and can achieve effective energy conversion. With this quantum effect of the quantum dots, transport of carriers between the quantum dots is allowed. In the description below, the quantum dot structure shown in FIG. 1 is also referred to as a "quantum network (net) structure."

Referring to FIG. 1, in the quantum net structure, quantum dots (nanoparticles) 30 implement a "first semiconductor member" having a first band gap. A base material 20 in which quantum dots 30 are distributed forms an energy barrier layer and implements a "second semiconductor member" having a second band gap greater than the first band gap. In thermoelectric material 10, quantum dots 30 and base material 20 are alternately arranged in the direction of carrier transport. Since the direction of quantization can thus match with the direction of carrier transport in thermoelectric material 10, the quantum effect can be exhibited.

Figure 2:
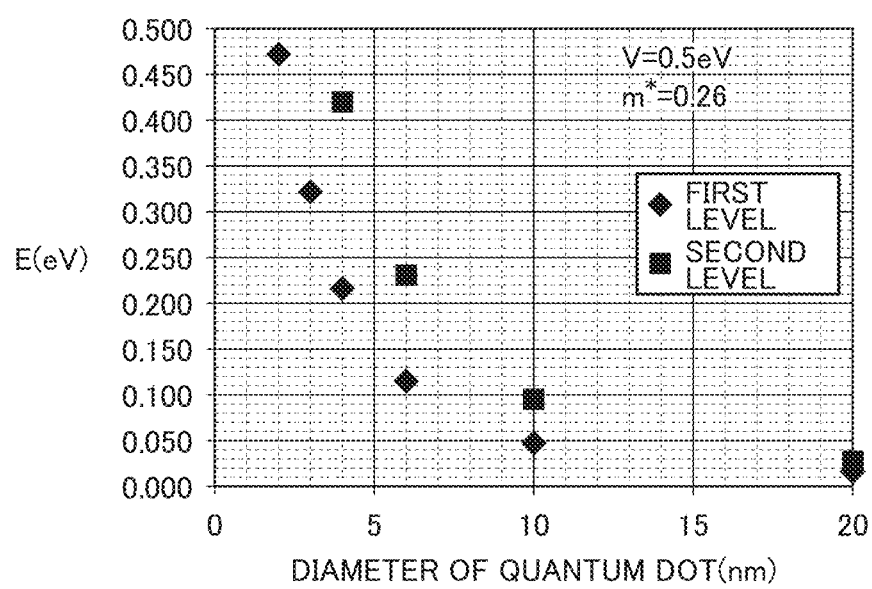
FIG. 2 is a diagram showing relation between a particle size of quantum dots and a quantum level.
Figure 3:
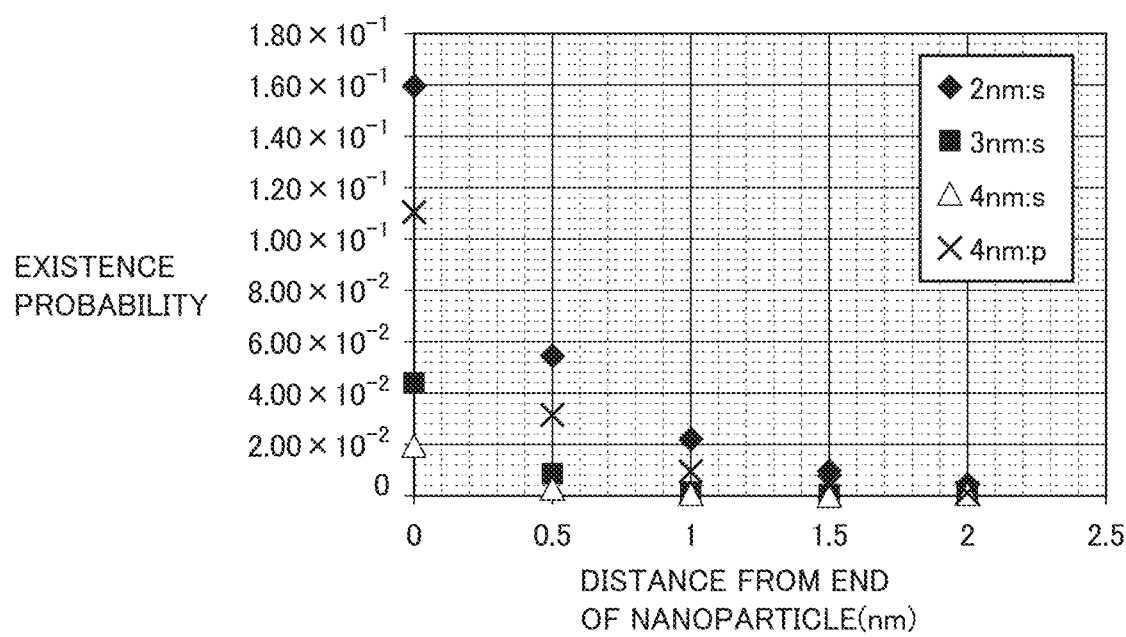
FIG. 3 is a diagram showing relation between a distance from an end of a nanoparticle and an existence probability of carriers.

In quantum dots (nanoparticles) 30, a state that an electron state in a valence band and a conduction band is quantized in a three-dimensional direction and an energy level is discretized can be obtained. A particle size $\phi$ of quantum dot 30 is preferably a particle size appropriate for producing a sufficient quantum effect. An interparticle distance d between quantum dots 30 (corresponding to a shortest distance from one end surface to the other end surface between adjacent quantum dots 30) is preferably set to an interval appropriate for combination of wave functions 32 of carriers. The present inventor has studied particle size $\phi$ of and interparticle distance d between quantum dots 30 appropriate for quantization, by solving the Schrödinger equation for three-dimensional finite potential quantum dots. FIGS. 2 and 3 show results of the studies.

FIG. 2 is a diagram showing relation between a particle size of a quantum dot and a quantum level. The ordinate in FIG. 2 represents quantum levels of a quantum dot (a first level and a second level) and the abscissa represents a particle size $\phi$ (nm) of the quantum dot. It can be seen with reference to FIG. 2 that a quantum level is formed when the quantum dot has particle size $\phi$ smaller than 20 nm. It is thus expected that the quantum effect is obtained when the quantum dot has particle size $\phi$ smaller than 20 nm. In order to achieve a noticeable quantum effect, the quantum dot has particle size $\phi$ preferably not greater than 5 nm and more preferably not greater than 3 nm. In order to express the quantum effect, the quantum dots have a particle size preferably not smaller than 0.1 nm.

FIG. 3 is a diagram showing relation between a distance from an end surface of a quantum dot and an existence probability of carriers. The ordinate in FIG. 3 represents an existence probability of carriers and the abscissa represents a distance (nm) from an end surface of a quantum dot. In FIG. 3, an existence probability of carriers from an end surface of a quantum dot was calculated by solving the Schrödinger equation for each of four types of quantum dots different in particle size from one another (particle sizes of 2 nm, 3 nm, and 4 nm on an s orbital and a particle size of 4 nm on a p orbital).

Referring to FIG. 3, the existence probability of carriers is highest at the end surface of the quantum dot and lowers as a distance from the end surface is greater. An existence probability of each of the four types of the quantum dots is substantially 0 when a distance from the end surface reaches 2 nm. It can thus be seen that carriers are present in at least one type of quantum dots within a range where a distance from the end surface of the quantum dot is not greater than 1.5 nm. It is further preferable that carriers are present in at least two types of quantum dots within a range where a distance from the end surface of the quantum dot is not greater than 1 nm. Therefore, it is expected that, by setting an interval between an end surface of one quantum dot and an end surface of the other quantum dot between two proximate quantum dots to 2 nm (=1 nm×2) or smaller, wave functions can be combined between the two quantum dots.

Since the quantum effect is not expressed if two quantum dots are in contact with each other, the interval is preferably not smaller than 0.1 nm.

As set forth above, in the quantum net structure according to the first embodiment, preferably, a quantum dot has particle size $\phi$ not smaller than 0.1 nm and not greater than 5 nm and interparticle distance d between quantum dots is not smaller than 0.1 nm and not greater than 2 nm. In the thermoelectric material having such a quantum net structure, particle size $\phi$ of the quantum dot corresponds to a width of the quantum dot in the direction of carrier transport, and interval d between quantum dots corresponds to a distance between the quantum dots in the direction of carrier transport.

2. Method of Manufacturing Thermoelectric Material

A method of manufacturing a thermoelectric material according to the first embodiment will now be described.

In the description below, a base material element corresponds to one example of the "first material," a different element corresponds to one example of the "second material," and the base material corresponds to one example of the "mixture of the first material and the second material."

Thermoelectric material 10 (see FIG. 1) having a quantum net structure contains a base material element having a band gap and a different element different from the base material element. Thermoelectric material 10 is manufactured by forming nanoparticles 30 in base material 20 which is a mixture of the base material element and the different element. Nanoparticles 30 contain at least the base material element.

The method of manufacturing nanoparticles includes a stacking step of alternately stacking a first layer containing the different element (the second material) and a second layer not containing the different element and an annealing step of forming nanoparticles in the base material by subjecting the stack of the first layer and the second layer to annealing treatment.

Examples of a semiconductor material forming the base material include silicon germanium (for example, SiGe), a bismuth tellurium base (for example, $Bi_2Te_3$, $Bi_2Sb_3$, and $Pb_2Te_3$), a magnesium silicide base (for example, $MgSi_2$), a strontium titanate base (for example, $SrTiO_3$, $LaSrTiO_3$, $LaSrTiO_3$:NiMO, $LaSrCuO_4$, and $NdCeCuO_4$), an iron silicide base (for example, $FeSi_2$, $FeMnSi_2$, and $FeCoSi_2$), a half-Whistler base (for example, ZrNiSn, TiZrNiSn, and (Ti, Zr, Hf)Ni(Sn, Sb)), a skutterudite base (for example, La—Fe—Sb and Ce—Co—Sb), a zinc antimony base (for example, ZnSb, $Zn_4Sb_3$, and $Zn_3Sb_2$), a boron based compound (for example, $CaB_6$, $SrB_6$, and $BaB_6$), a Co based oxide (for example, $NaCoO_2$, $NaCo_2O_4$, $Ca_2CoO_3$, $Ca_3Co_4O_9$, and $Sr_2(BiPb)_2O_4$), tin oxide (for example, $SnO_2$), lead oxide (for example, ZnO), indium oxide (for example, $In_2O_3$), and a nitride semiconductor (for example, GaN, InGaN, AlN, InAlN, and InAlGaN).

When the base material is composed of silicon germanium, the base material element is Si and Ge and examples of the different element include gold (Au), copper (Cu), boron (B), aluminum (Al), and phosphorus (P). When the base material is composed of a bismuth tellurium base, the base material element is Bi and Te or Pb and examples of the different element include Au, Cu, B, and Al. When the base material is composed of a magnesium silicide base, the base material element is Mg and Si and examples of the different element include Au, Cu, B, Al, and P. When the base material is composed of a nitride semiconductor, the base material element contains at least Ga and N and examples of the different element include In (indium) and Al.

In the stacking step, each layer can be stacked with molecular beam epitaxy (MBE), electron beam (EB), sputtering, metal-organic vapor phase epitaxy (MOVPE), or vapor deposition. A concentration of atoms of the different element in the first layer is preferably from 0.01 to 50 atomic %. The first layer may be formed from a single layer or multiple layers.

A base material element contained in the first layer containing a different element herein is referred to as the "first element" and a base material element contained in the second layer not containing a different element is also referred to as the "second element." The first element is characterized by being lower than the second element in melting point in alloying with a different element. Therefore, when silicon germanium is employed as the base material, Ge is defined as the first element and Si is defined as the second element.

In the stacking step, the base material element is totally contained in at least one of the first layer and the second layer. For example, when the base material is composed of silicon germanium, Ge is contained as the base material element in the first layer and Si is contained as the base material element in the second layer.

In the stacking step, the first layer and the second layer can alternately be stacked, and for example, each of the first layer and the second layer can be stacked 1 to 1000 times. The number of times of stacking the first layer substantially matches with the number of formed nanoparticles in a direction of thickness.

In the annealing step, the stack of the first layer and the second layer is subjected to annealing treatment so that nanoparticles are formed in the base material. The annealing treatment here refers to treatment for cooling after heating until atoms in the first layer are diffused. Therefore, a temperature and a time period for annealing treatment are different depending on a material for the first layer. By controlling a temperature and a time period for annealing treatment and a rate of temperature increase in annealing treatment, whether or not nanoparticles are formed and a particle size of formed nanoparticles can be adjusted.

The stacking step and the annealing step may be performed independently of each other or simultaneously with each other. In performing the steps independently, the annealing step is performed after the stacking step of alternately stacking the first layer and the second layer is completed. In performing the steps simultaneously, the stacking step is performed under conditions for the annealing treatment so that the annealing treatment is performed simultaneously in the stacking step.

Figure 4:
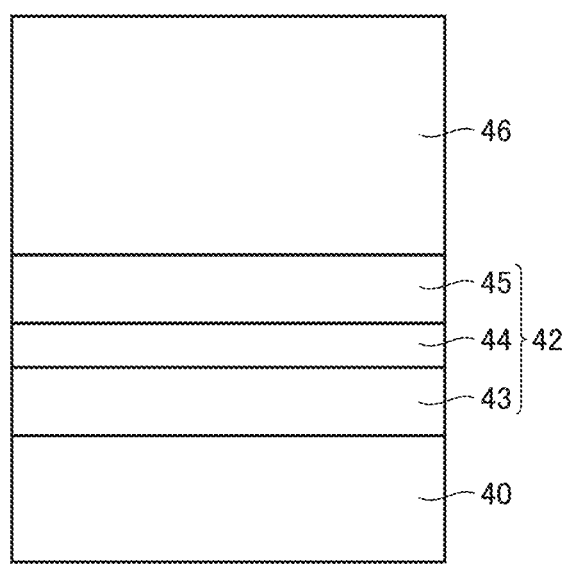
FIG. 4 is a cross-sectional view schematically showing a stack in a state after a stacking step which was performed once and before annealing treatment in the first embodiment.

FIG. 4 is a cross-sectional view schematically showing a stack in a state after the stacking step which was performed once and before annealing treatment. In the present embodiment, silicon germanium is adopted as the base material and Au is adopted as the different element.

In the stacking step, initially, a sapphire substrate 40 is prepared, and a first layer 42 constituted of an amorphous Ge (a-Ge) layer 43/an Au layer 44/an amorphous Ge (a-Ge) layer 45 is formed by successively depositing Ge, Au, and Ge with MBE. Thereafter, a second layer 46 formed from an amorphous Si (a-Si) layer is formed by depositing Si. Each source material of Ge, Au, and Si is heated with electron beam in a cell to thereby emit molecular beams. A stack is formed by repeating stacking of first layer 42 and second layer 46 60 times. The stack has a thickness of approximately 300 nm.

In the present embodiment, since deposition is easy, the a-Ge layer and the Au layer are separate in first layer 42. So long as Ge and Au are included in the first layer, however, limitation to such a deposition method is not intended. For example, first layer 42 may be formed by depositing AuGe by heating a master alloy of Ge and Au with electron beam in each cell to emit molecular beams. Alternatively, first layer 42 may be formed by depositing AuGe by heating a GeAu compound with electron beam in one cell to emit molecular beams.

Thereafter, nanoparticles are formed by subjecting the stack to annealing treatment. Through annealing treatment, a plurality of nanoparticles of SiGe containing Au are formed in the base material composed of Si and Ge. A mechanism of formation of nanoparticles as such in the present embodiment is understood as follows. Initially, AuGe lower in eutectic point than AuSi is activated in first layer 42, thereafter Si contained in second layer 46 is taken in, and thus nanoparticles of SiGe containing Au are formed. The nanoparticles formed through the annealing treatment may include also nanoparticles of SiGe not containing Au. The base material composed of Si and Ge around nanoparticles of SiGe is composed of amorphous SiGe, amorphous Ge, or amorphous Si.

Though a temperature for annealing treatment can be selected as appropriate from a range of 200 to 800° C., in order to obtain nanoparticles having a particle size not greater than 5 nm, a temperature for annealing treatment is preferably from 300° C. to 800° C. A time period for annealing treatment in the annealing step can be set, for example, to 1 to 120 minutes. When a temperature for annealing treatment is set to 600° C., a time period for annealing treatment is preferably set to 15 minutes.

3. Evaluation of Thermoelectric Material

Seebeck coefficient S and conductivity σ were measured for a plurality of samples and thermoelectric characteristics when a sample was used as a thermoelectric material were evaluated. Some of the plurality of samples were obtained by depositing the first layer and the second layer with molecular beam epitaxy (MBE) and remaining samples were obtained by depositing the first layer and the second layer with electron beam (EB).

(Measurement of Dimensionless Performance Index)

Seebeck coefficient S of the plurality of samples is measured with a thermoelectric characteristic evaluation apparatus (a name of an apparatus: ZEM3 manufactured by ULVAC-RIKO Inc.). Conductivity σ of the plurality of samples is measured with a conductivity measurement apparatus (a name of an apparatus: ZEM3 manufactured by ULVAC-RIKO Inc.). Dimensionless performance index ZT of the plurality of samples is calculated based on these measurement values.

Figure 5:
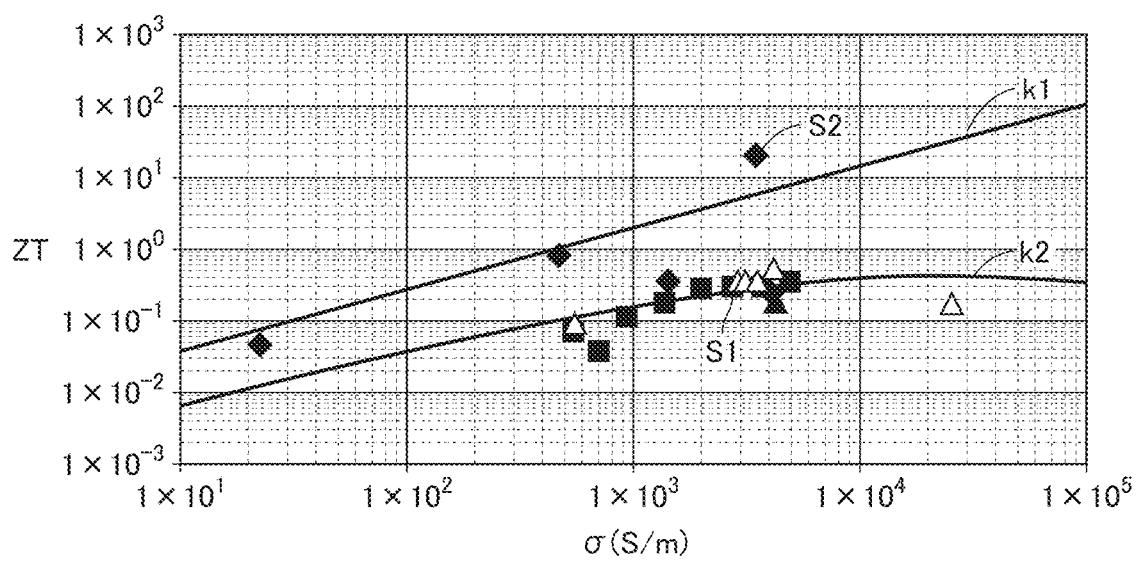
FIG. 5 is a diagram showing a result of calculation of a dimensionless performance index ZT of a plurality of samples.

FIG. 5 is a diagram showing a result of calculation of dimensionless performance index ZT of the plurality of samples. In FIG. 5, the ordinate represents dimensionless performance index ZT and the abscissa represents conductivity σ. In FIG. 5, theoretic lines representing thermoelectric characteristics of a bulk structure and a quantum net structure are also shown for comparison. In the figure, k1 represents relation between dimensionless performance index ZT and conductivity σ in the quantum net structure. In the figure, k2 represents relation between dimensionless performance index ZT and conductivity σ in the bulk structure. Namely, k1 is calculated based on Seebeck coefficient S and conductivity σ when variation in density of states owing to the quantum effect is taken in, and k2 is calculated based on Seebeck coefficient S and conductivity σ when variation in density of states owing to the quantum effect is not taken in.

Referring to FIG. 5, while most of the plurality of samples exhibit thermoelectric characteristics equivalent to those of the bulk structure, some samples exhibit high thermoelectric characteristics equivalent to those of the quantum net structure.

Then, a sample S1 exhibiting thermoelectric characteristics equivalent to those of the bulk structure and a sample S2 exhibiting good thermoelectric characteristics were extracted from the plurality of samples, and cross-sections of these two samples S1 and S2 were observed with a transmission electron microscope (TEM). TEM observation was conducted after the stack subjected to the annealing step was sliced with focused ion beam (FIB) in a direction of stack.

Figure 6:
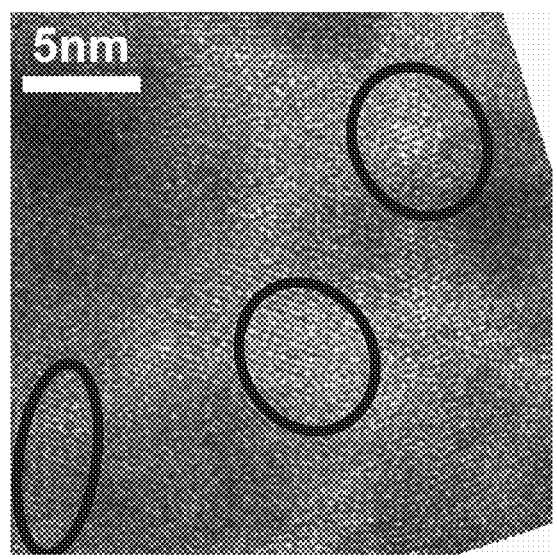
FIG. 6 is a diagram showing a high-resolution TEM image of a sample S1.
Figure 7:
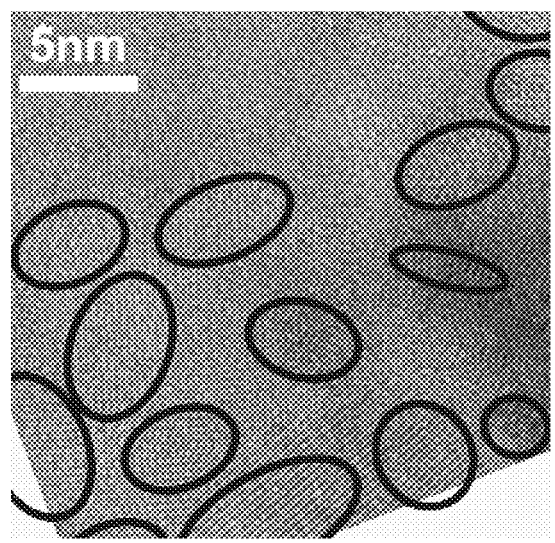
FIG. 7 is a diagram showing a high-resolution TEM image of a sample S2.

FIG. 6 shows a high-resolution TEM image of sample S1. FIG. 7 shows a high-resolution TEM image of sample S2. In FIGS. 6 and 7, a region surrounded with a solid line is a region estimated to be crystallized. When a grain size of crystal grains was actually measured in the high-resolution TEM image of sample S1 shown in FIG. 6, the crystal grains had a grain size from 2 to 5 nm. When an interval between crystal grains was actually measured, it was from 5 to 8 nm.

When a grain size of crystal grains was actually measured in the high-resolution TEM image of sample S2 shown in FIG. 7, the crystal grains had a grain size from 2 to 5 nm. When an interval between crystal grains was actually measured, it was from 1 to 2 nm. A crystal structure of this sample S2 is close to a crystal structure ideal for nanoparticles to exhibit the quantum effect. Namely, it is estimated that the quantum net structure according to the first embodiment has been realized in sample S2.

4. Control of Particle Size of and Interparticle Distance Between Nanoparticles

As described above, in order to effectively exhibit the quantum effect in the quantum net structure in the thermoelectric material according to the present embodiment, nanoparticles representing quantum dots have an average particle size $\phi_m$ preferably not smaller than 0.1 nm and not greater than 5 nm and more preferably not smaller than 0.1 nm and not greater than 3 nm. An average interparticle distance $d_m$ between nanoparticles is preferably not smaller than 0.1 nm and not greater than 2 nm.

Particle size $\phi$ of the nanoparticles herein refers to a longer diameter of particles measured in an image obtained with an electron microscope (a two-dimensional plane projection image) and average particle size $\phi_m$ refers to an arithmetic mean of particle sizes of a sufficient number of particles. An arithmetic mean of particle sizes of 22 particles was calculated herein as average particle size $\phi_m$.

Interparticle distance d between nanoparticles herein refers to a shortest distance from an end to an end of nanoparticles measured in an image obtained with an electron microscope (a two-dimensional plane projection image). Average interparticle distance $d_m$ refers to an arithmetic mean of interparticle distances among a sufficient number of nanoparticles. An arithmetic mean of interparticle distances among 22 nanoparticles is herein calculated as average interparticle distance din.

The present inventor has continued dedicated studies about control of particle size $\phi$ of and interparticle distance d between nanoparticles in order to form such nanoparticles in a stable manner, and has found that particle size $\phi$ of nanoparticles can be controlled based on a composition of a different element (second material) and interparticle distance d between nanoparticles can be controlled based on a composition ratio of base material elements.

The composition of a different element herein refers to a concentration of atoms (unit of atomic %) of a different element in the thermoelectric material. The composition ratio of the base material elements refers to a composition ratio of the second element to the first element.

Therefore, when silicon germanium is adopted as the base material and Au is adopted as the different element, a composition of the different element corresponds to a composition (a concentration of atoms) of Au and a composition ratio of the base material elements corresponds to a composition ratio (Si/Ge) of Si to Ge.

With a method of controlling particle size $\phi$ of and interparticle distance d between nanoparticles independently of each other by using individual and independent compositions as above, however, a new problem of difficulty in achieving both of optimal particle size $\phi$ and optimal interparticle distance d has arisen.

The present inventor has advanced dedicated studies in order to solve this new problem, and has consequently found that not only a composition of a different element but also a composition ratio of base material elements are involved with particle size $\phi$ of nanoparticles and that not only a composition ratio of base material elements but also a composition of a different element are involved with interparticle distance d between nanoparticles. This finding suggests that a composition of a different element and a composition ratio of base material elements cooperate to allow control of particle size $\phi$ of and interparticle distance d between nanoparticles. Then, the present inventor has studied about a composition of a different element and a composition ratio of base material elements which can achieve both of optimal particle size $\phi$ and optimal interparticle distance d based on this finding.

A method of controlling particle size $\phi$ of and interparticle distance d between nanoparticles based on a composition of Au representing a different element and a composition ratio Si/Ge of Si to Ge representing a composition ratio of base material elements in the thermoelectric material in which nanoparticles of SiGe containing Au are distributed in a base material containing Si and Ge will be described below.

(1) Derivation of Experimental Expression

The present inventor has initially attempted to derive an experimental expression representing relation between a composition of Au and a composition ratio Si/Ge for each of particle size $\phi$ and ratio of crystallization $\eta$ of nanoparticles in the thermoelectric material. Ratio of crystallization $\eta$ refers to a ratio of nanoparticles in the thermoelectric material in which a base material composed of amorphous SiGe, amorphous Si, and amorphous Ge as well as nanoparticles are present as being mixed.

Ratio of crystallization $\eta$ of each sample was calculated based on Raman scattering measurement. Ratio of crystallization $\eta$ refers to a ratio (Ic/Ia) of an integrated intensity (Ic) of single crystal SiGe to an integrated intensity (Ia) of amorphous SiGe found from spectra in Raman spectrometry Specifically, LabRAM HR Evolution manufactured by HORIBA, Ltd. or RAMAN touch manufactured by Nanophoton Corporation may be used for Raman scattering measurement. An excitation wavelength is set to 532 nm, a magnification of an objective is set to 50×, and excitation power at a sample plane is set to 2.5 mW or lower. Since crystallization with laser beams occurs with high excitation power, dependency on excitation power should be known before actually conducting measurement, and measurement should be conducted with excitation power which will not cause crystallization.

Figure 8:
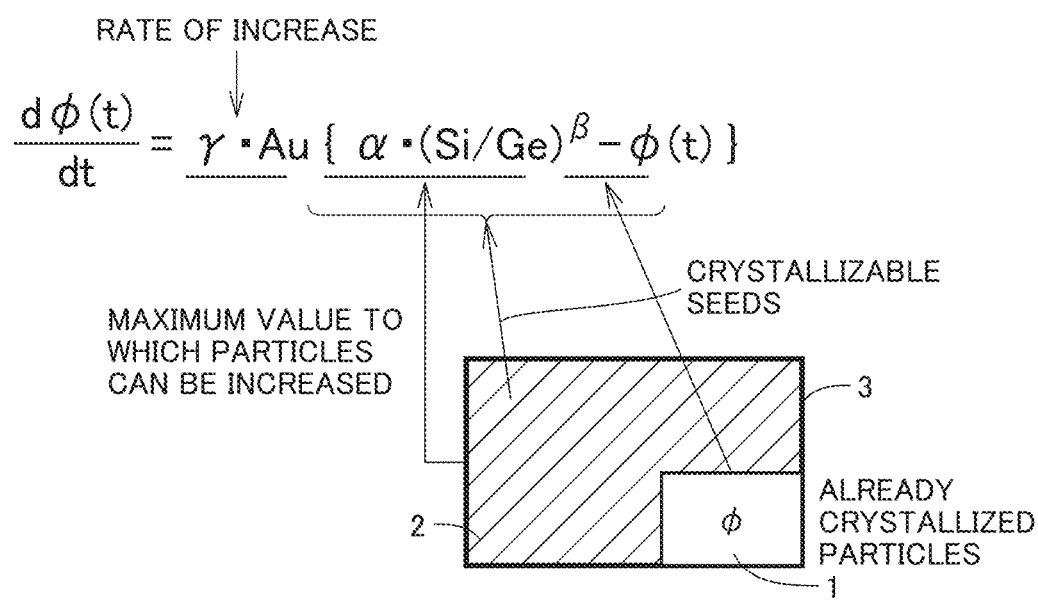
FIG. 8 is a diagram schematically showing a physical model of a thermoelectric material.

In order to derive an experimental expression, the present inventor has come up with a physical model of crystallization of nanoparticles in the thermoelectric material. FIG. 8 schematically shows a physical model of the thermoelectric material.

In FIG. 8, a region 1 represents already crystallized particles. The physical model assumes that particles are crystallized with this region 1 functioning as a nucleus. As crystallization proceeds, grain size $\phi$ of crystal grains increases.

A region 3 (a rectangular region surrounded with a bold line in the figure) represents a limit up to which grain size $\phi$ of crystal grains can increase. A remaining region 2 with region 1 being excluded from region 3 (an L-shaped region shown with hatching in the figure) represents crystallizable seeds.

In order to express increase over time in grain size $\phi$ of crystal grains in such a physical model, the present inventor has come up with a differential equation shown in an expression (6) below:

$$\frac{d\phi(t)}{dt} = \gamma \cdot \text{Au}\{\alpha \cdot (\text{Si/Ge})^\beta - \phi(t)\} \quad (6)$$

where $\phi$ represents a grain size of crystal grains, t represents a time period for annealing treatment, Au represents a composition (a concentration of atoms) of Au, Si/Ge represents a composition ratio Si/Ge, $\alpha$ and $\gamma$ are proportionality factors, and $\beta$ is a factor for converting the composition ratio Si/Ge to a parameter suitable for modeling.

The expression (6) represents a rate (=d$\phi$(t)/dt) of increase in grain size $\phi$(t) when a time period for annealing treatment is set to t. "$\alpha \cdot (\text{Si/Ge})^\beta$" on the right side of the expression (6) corresponds to region 3 and gives a maximum value of grain size $\phi$. "$\phi$(t)" corresponds to region 1 and represents a particle size of already crystallized particles. A result of subtraction of $\phi$(t) from $\alpha \cdot (\text{Si/Ge})^\beta$, that is, $\{\alpha \cdot (\text{Si/Ge})^\beta - \phi(t)\}$, corresponds to region 2 and represents crystallizable seeds.

"$\gamma \cdot$Au" by which crystallizable seeds are multiplied gives a rate of increase in grain size of crystal grains. This is based on the fact that nanoparticles are formed with Au functioning as a nucleus which induces crystals. Grain size $\phi$(t) of crystal grains can be expressed in an expression (7) below by solving the differential equation in the expression (6).

$$\phi(t) = \alpha \cdot (\text{Si/Ge})^\beta \{1 - \exp(-\gamma \cdot \text{Au} \cdot t)\} \quad (7)$$

The expression (7) means that grain size $\phi$ of crystal grains increases with "$\alpha \cdot (\text{Si/Ge})^\beta$" being defined as the maximum value and "$\gamma \cdot$Au" being defined as a rate of increase. A growth model that ratio of crystallization $\eta$ increases in the thermoelectric material with progress of crystallization of grains in accordance with the expression (7) is considered. According to this growth model, ratio of crystallization $\eta$ becomes a function of grain size $\phi$ and can be given in an expression (8) below.

$$\eta(t) \propto \phi(t)^3 \quad (8)$$

Figure 9:
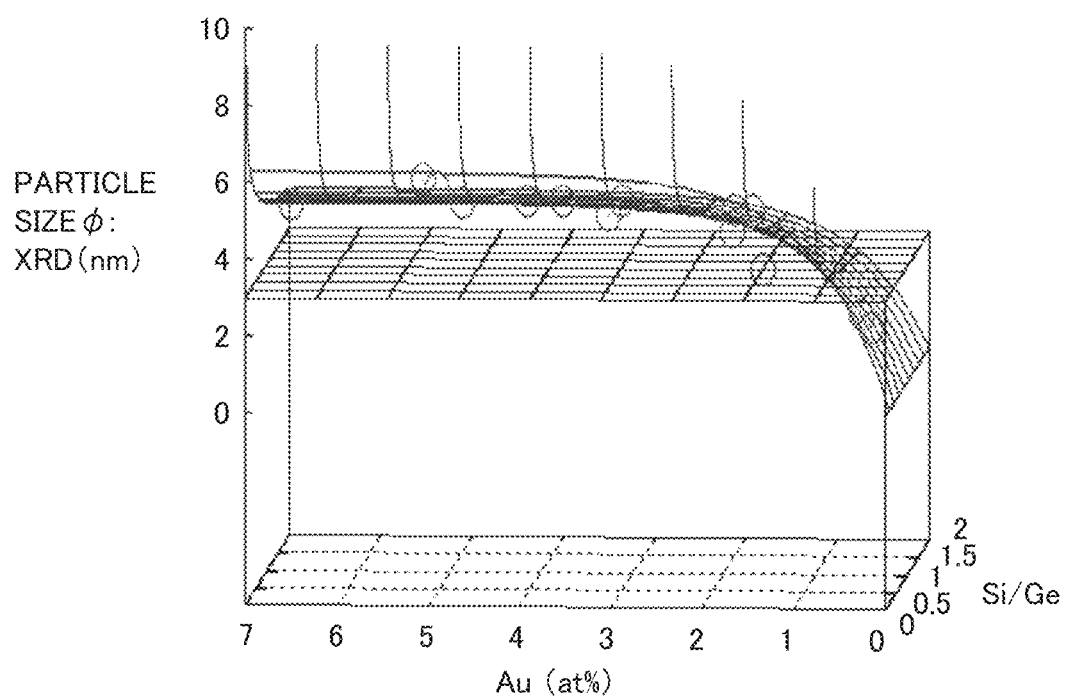
FIG. 9 is a diagram of a three-dimensional plot of a particle size φ of nanoparticles as a function of two variables of a composition (concentration of atoms) of Au and a composition ratio Si/Ge.
Figure 10:
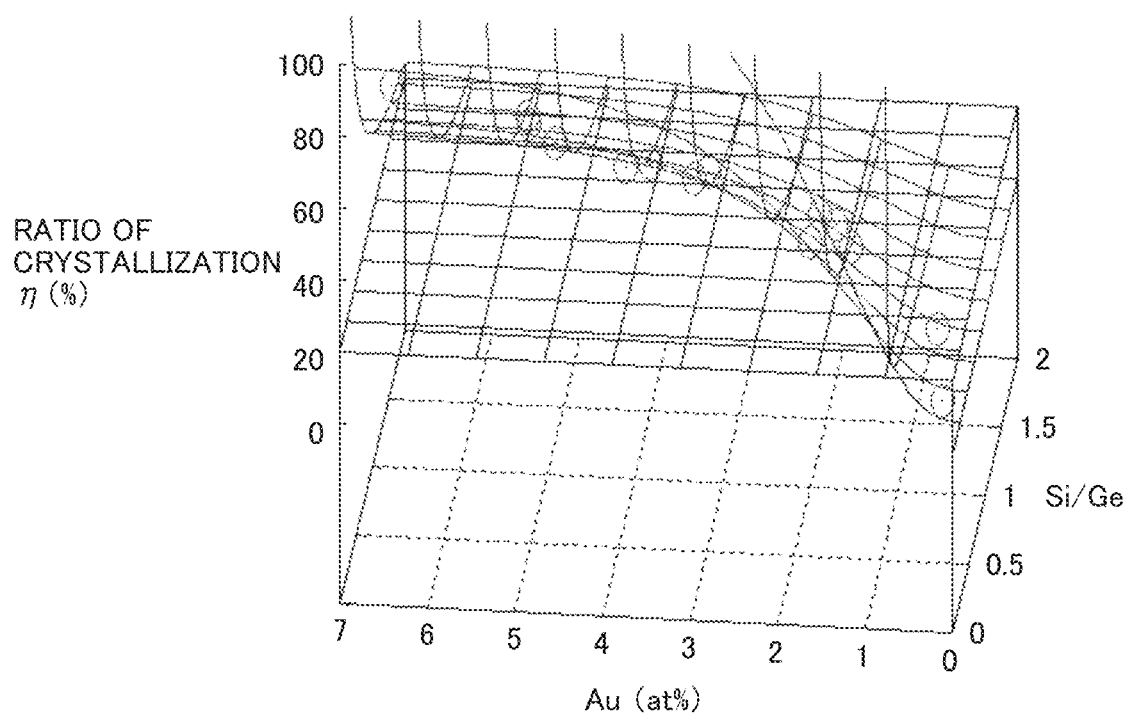
FIG. 10 is a diagram of a three-dimensional plot of a ratio of crystallization η of a thermoelectric material as a function of two variables of a composition of Au and a composition ratio Si/Ge.

Then, the present inventor has fitted data on a plurality of samples manufactured with the manufacturing method according to the present embodiment to the experimental expressions (7) and (8) for grain size $\phi$ and ratio of crystallization $\eta$ described above. FIGS. 9 and 10 show results of fitting.

FIG. 9 is a diagram of a three-dimensional plot of particle size $\phi$ of nanoparticles as a function of two variables of a composition (a concentration of atoms) of Au and a composition ratio Si/Ge. In FIG. 9, a coordinate position in the horizontal direction represents a concentration of atoms (at %) of Au, a coordinate position in a vertical direction represents particle size $\phi$ (nm) of nanoparticles, and a coordinate position in a depth direction represents a composition ratio Si/Ge. Time period for annealing treatment t is set to fifteen minutes.

FIG. 9 shows data on a plurality of samples with circles. Data on each sample includes a composition of Au, a composition ratio Si/Ge, and particle size $\phi$ of nanoparticles in that sample.

Particle size $\phi$ of the nanoparticles in each sample is calculated in a Scherrer's equation based on a result of measurement in X-ray analysis (XRD). A composition of Au in the sample is calculated from a result of measurement with an electron probe micro analyzer (EPMA). Specifically, EPMA (a name of an apparatus: JXA-8530F manufactured by JEOL Ltd.) is used to measure a concentration of atoms of Au in the sample. An acceleration voltage of 7 kV and a probe diameter of 100 µm are set as measurement conditions. An average value of results of measurement of the concentration of atoms of Au at three points in a plane of the sample is calculated as a composition of Au in the sample.

Influence by a substrate (sapphire substrate 40) supporting the stack may appear in the result of measurement with EPMA. In this case, an element making up the substrate other than elements making up the stack is also determined. For example, in a sample constructed to support a thin film containing nanoparticles and having a thickness of approximately 300 nm on a sapphire substrate, not only elements (Si, Ge, and Au) of the thin film but also elements (Al and O) of the sapphire substrate may be detected in measurement with EPMA. Therefore, a composition of the elements of the thin film should be corrected based on a composition of the sapphire substrate. Specifically, a composition of Al is corrected to zero by correcting the composition of the elements of the thin film based on a composition ratio $Al_2O_3$.

Alternatively, other than measurement with EPMA, a composition of Au can also be calculated from a result of measurement with energy dispersive X-ray spectroscopy (EDX). Specifically, a scanning electron microscope (SEM) (a name of an apparatus: S-4300SE manufactured by Hitachi Ltd.) to which an EDX apparatus (a name of an apparatus: OCTANE PLUS manufactured by Ametec, Inc.) is attached is used to measure a concentration of atoms of Au at three points in the plane of the sample. An acceleration voltage from 5 to 15 kV and a measurement area of 120 µm×100 µm are set as measurement conditions. An average value of results of measurement of the concentration of atoms of Au at three points in the plane of the sample is calculated as the concentration of atoms of Au in the sample.

In measurement with EDX as well, influence by the substrate may appear in the result of measurement as in measurement with EPMA. In such a case, as in measurement with EPMA, a composition of the substrate should only be corrected to zero by correcting a composition of the elements of the thin film based on the composition of the substrate.

Regarding the composition ratio Si/Ge, initially, a composition (concentration of atoms) of Ge and a composition (concentration of atoms) of Si in the sample are calculated in measurement with EPMA. Conditions for measurement with EPMA are the same as the conditions for measurement used for calculation of the composition of Au. Then, a ratio of the concentration of atoms of Si to the concentration of atoms of Ge is calculated as the composition ratio Si/Ge. The composition ratio Si/Ge can also be calculated based on a result of measurement with EDX instead of EPMA.

As shown in FIG. 9, with attention being paid to a certain composition ratio Si/Ge in the three-dimensional plot in the experimental expression (7), with increase in composition of Au, particle size φ of nanoparticles increases. With attention being paid to a certain composition of Au, with lowering in composition ratio Si/Ge, particle size φ of nanoparticles increases. It was confirmed in FIG. 9 that data on a plurality of samples well matched with the three-dimensional plot. FIG. 9 shows that the expression (7) is suitable as the experimental expression representing particle size φ of nanoparticles. Therefore, it is expected that particle size φ of nanoparticles can be controlled based on the composition of Au and the composition ratio Si/Ge by using the experimental expression (7).

FIG. 10 is a diagram of a three-dimensional plot of ratio of crystallization η of a thermoelectric material as a function of two variables of a composition (a concentration of atoms) of Au and a composition ratio Si/Ge. In FIG. 10, a coordinate position in the horizontal direction represents a concentration of atoms (at %) of Au, a coordinate position in a vertical direction represents ratio of crystallization η of the thermoelectric material, and a coordinate position in a depth direction represents a composition ratio Si/Ge. Time period for annealing treatment t is set to fifteen minutes.

FIG. 10 shows data on a plurality of samples with circles. Data on each sample includes a composition of Au, a composition ratio Si/Ge, and ratio of crystallization η (%) in that sample.

Ratio of crystallization η of each sample was calculated based on Raman scattering measurement. Ratio of crystallization η refers to a ratio (Ic/Ia) of an integrated intensity (Ic) of single crystal SiGe to an integrated intensity (Ia) of amorphous SiGe found from spectra in Raman spectrometry Specifically, LabRAM HR Evolution manufactured by HORIBA, Ltd. or RAMAN touch manufactured by Nanophoton Corporation may be used for Raman scattering measurement. An excitation wavelength is set to 532 nm, a magnification of an objective is set to 50×, and excitation power at a sample plane is set to 2.5 mW or lower. Since crystallization with laser beams occurs with high excitation power, dependency on excitation power should be known before actually conducting measurement, and measurement should be conducted with excitation power which will not cause crystallization.

With attention being paid to a certain composition ratio Si/Ge in the three-dimensional plot in the experimental expression (8), with increase in composition of Au, ratio of crystallization η increases. With attention being paid to a certain composition of Au, with lowering in composition ratio Si/Ge, ratio of crystallization η increases. It was confirmed in FIG. 10 that data on a plurality of samples well matched with the three-dimensional plot. It can thus be seen that the expression (8) is suitable as the experimental expression representing ratio of crystallization η. Therefore, it is expected that ratio of crystallization η can be controlled based on the composition of Au and the composition ratio Si/Ge by using the experimental expression (8).

Figure 11:
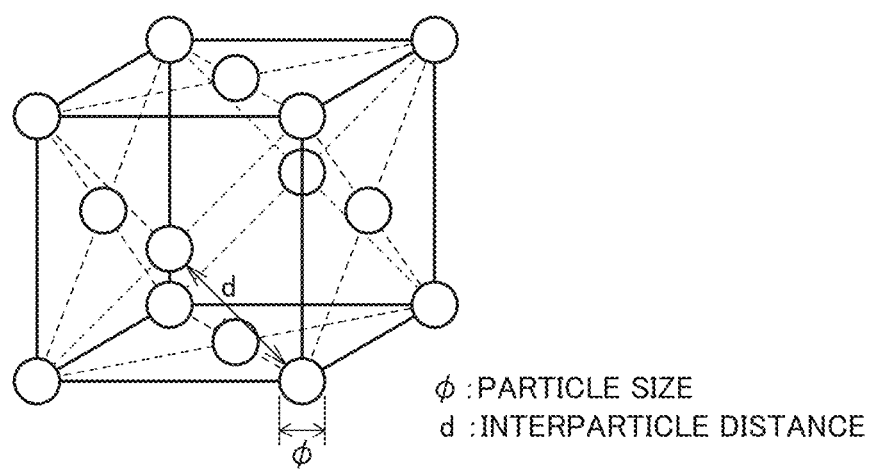
FIG. 11 is a diagram schematically showing distribution of nanoparticles in a base material.

Interparticle distance d between nanoparticles can be controlled based on ratio of crystallization η. FIG. 11 is a diagram schematically showing distribution of nanoparticles in a base material. When a crystal structure of nanoparticles is regarded as a face-centered cubic lattice structure as shown in FIG. 11, a space filling factor of nanoparticles is 74% (=2$^{1/2}$π/6). Ratio of crystallization η of the thermoelectric material can be derived as a volume ratio of nanoparticles in a base material which is a cube having one side of 2$^{1/2}$(d+φ) to the base material. Ratio of crystallization η can be expressed in an expression (9) below.

$$\eta = \frac{\sqrt{2}\pi}{6}\left(\frac{\phi}{d+\phi}\right)^3 \tag{9}$$

Since the expression (9) can further be deformed to an expression (10) below, it can be seen that interparticle distance d between nanoparticles is a function of particle size φ and ratio of crystallization η. It can be seen that interparticle distance d between nanoparticles can be controlled by controlling particle size φ and ratio of crystallization η.

$$d = \phi\left\{\left(\frac{\sqrt{2}\pi}{6}\right)^3 \frac{1}{\eta^{1/3}} - 1\right\} \tag{10}$$

As described with reference to FIG. 10, ratio of crystallization η can be controlled based on a composition of Au and a composition ratio Si/Ge. It is thus expected that interparticle distance d between nanoparticles can be controlled substantially based on the composition of Au and the composition ratio Si/Ge.

According to the expression (9), it is estimated that ratio of crystallization η should be not lower than 27% in order for interparticle distance d to be not greater than 2 nm when nanoparticles have particle size φ of 5 nm. It is further estimated that the ratio of crystallization should be not lower than 16% in order for interparticle distance d to be not greater than 2 nm when nanoparticles have particle size φ of 3 nm. It is thus considered that ratio of crystallization η is preferably not lower than 16% in order for interparticle distance d to be not greater than 2 nm when nanoparticles have particle size φ not greater than 5 nm and preferably not greater than 3 nm.

(2) Optimization of Composition of Au and Composition Ratio Si/Ge

In order to realize a structure in which nanoparticles have particle size φ not greater than 5 nm and the thermoelectric material has ratio of crystallization η not lower than 16%, a composition ratio of Au and a composition ratio Si/Ge are optimized by using the experimental expressions (7) and (8). Optimization of the composition of Au and the composition ratio Si/Ge will be described below with reference to FIGS. 12 to 14.

Figure 12:
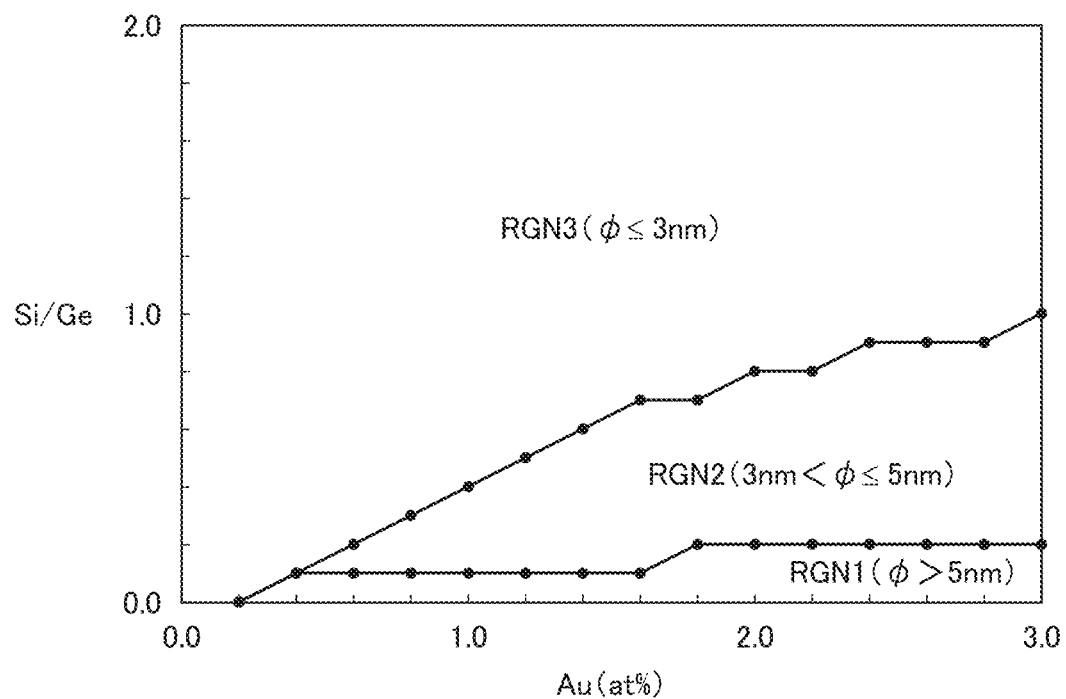
FIG. 12 is a diagram showing relation of particle size φ of nanoparticles with a composition of Au and a composition ratio Si/Ge.

FIG. 12 is a diagram showing relation of particle size φ of nanoparticles with a composition of Au and a composition ratio Si/Ge. The relation shown in FIG. 12 is based on a result of calculation of particle size φ of nanoparticles with the experimental expression (7), with a composition (a concentration of atoms) of Au and a composition ratio Si/Ge being adopted as two variables.

The ordinate in FIG. 12 represents a composition ratio Si/Ge and the abscissa represents a concentration of atoms (at %) of Au. In FIG. 12, a region RGN1 represents a range of the composition of Au and the composition ratio Si/Ge when particle size φ satisfies a condition of φ>5 nm. A region RGN2 represents a range of the composition of Au and the composition ratio Si/Ge when particle size φ satisfies a condition of 3 nm<φ≤5 nm. A region RGN3 represents a range of the composition of Au and the composition ratio Si/Ge when particle size φ satisfies a condition of φ≤3 nm.

It can be seen according to the relation shown in FIG. 12 that nanoparticles having particle size φ not greater than 5 nm can be formed by adopting the composition of Au and the composition ratio Si/Ge satisfying either region RGN2 or RGN3. In particular, it can be seen that nanoparticles having particle size φ not greater than 3 nm can be formed by adopting the composition of Au and the composition ratio Si/Ge satisfying region RGN3.

Figure 13:
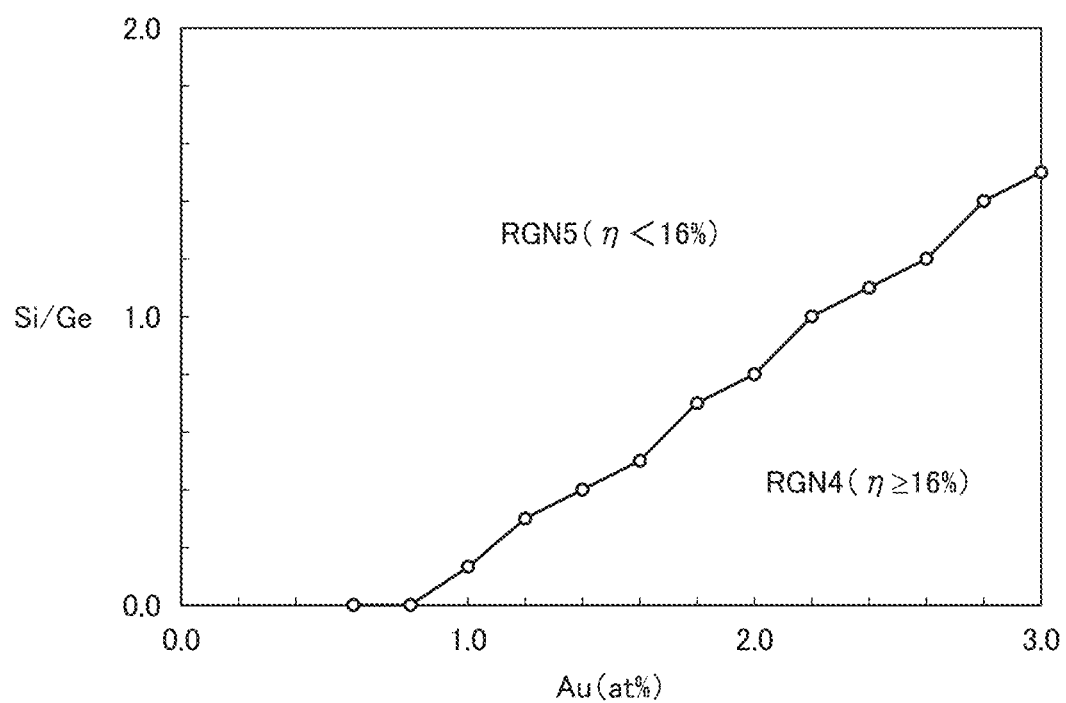
FIG. 13 is a diagram showing relation of ratio of crystallization η with a composition of Au and a composition ratio Si/Ge.

FIG. 13 is a diagram showing relation of ratio of crystallization η with a composition of Au and a composition ratio Si/Ge. The relation shown in FIG. 13 is based on results of calculation of ratio of crystallization η with the experimental expression (8), with the composition of Au and the composition ratio Si/Ge being adopted as two variables.

The ordinate in FIG. 13 represents a composition ratio Si/Ge and the abscissa represents a concentration of atoms (at %) of Au. In FIG. 13, a region RGN4 represents a range of the composition of Au and the composition ratio Si/Ge when ratio of crystallization η satisfies a condition of η≥16%. A region RGN5 represents a range of the composition of Au and the composition ratio Si/Ge when ratio of crystallization η satisfies a condition of η<16%.

According to the relation shown in FIG. 13, ratio of crystallization η can be 16% or higher by adopting the composition of Au and the composition ratio Si/Ge satisfying region RGN4.

Figure 14:
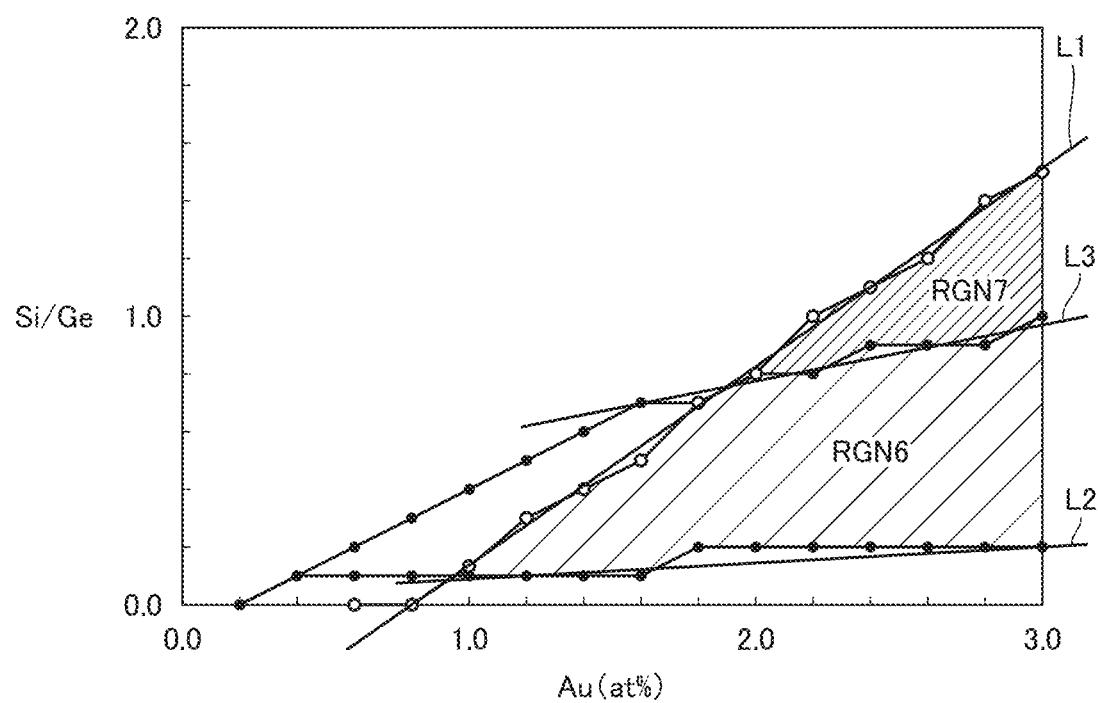
FIG. 14 is a diagram obtained by superimposing the relation shown in FIG. 12 and the relation shown in FIG. 13 on each other.

FIG. 14 is obtained by superimposing the relation shown in FIG. 12 and the relation shown in FIG. 13 on each other. In FIG. 14, a region RGN6 is a region defined as region RGN2 in FIG. 12 (3 nm<φ≤5 nm) and region RGN4 in FIG. 13 (η≥16%) are superimposed on each other. Therefore, region RGN6 corresponds to a range of the composition of Au and the composition ratio Si/Ge when particle size φ satisfies a condition of 3 nm<φ≤5 nm and the ratio of crystallization satisfies a condition of η≥16%.

In FIG. 14, a region RGN7 is a region defined as region RGN3 in FIG. 12 (φ≤3 nm) and region RGN4 in FIG. 13 (η>16%) are superimposed on each other. Therefore, region RGN7 corresponds to a range of the composition of Au and the composition ratio Si/Ge when particle size φ satisfies a condition of φ≤3 nm and the ratio of crystallization satisfies a condition of η≥16%.

A region which is combination of region RGN6 and region RGN7 corresponds to a range of the composition of Au and the composition ratio Si/Ge when particle size φ satisfies a condition of φ≤5 nm and the ratio of crystallization satisfies a condition of η≥16%.

By expressing a boundary of each of regions RGN6 and RGN7 with lines L1, L2, and L3 in FIG. 14, a range of the composition of Au and the composition ratio Si/Ge included in each region can numerically be calculated. Specifically, each of lines L1, L2, and L3 can approximate the composition ratio Si/Ge and the composition of Au located on a corresponding boundary to a linear function with the use of the least square method. Lines L1, L2, and L3 can thus be expressed with expressions (11), (12), and (13) below, respectively:

$$r \leq 0.62c - 0.25 \quad (11)$$

$$r \geq 0.05c - 0.06 \quad (12)$$

$$r \geq 0.23c + 0.3 \quad (13)$$

where c represents a composition of Au (the unit being atomic %) and r represents a composition ratio Si/Ge.

Thus, a region surrounded by lines L1 and L2 corresponds to a range of the composition of Au and the composition ratio Si/Ge where particle size φ satisfies a condition of φ≤5 nm and ratio of crystallization η satisfies a condition of η≥16%. The composition of Au and the composition ratio Si/Ge included in the range satisfy the relational expressions in the expressions (11) and (12). In other words, as the composition of Au and the composition ratio Si/Ge satisfy the relational expressions in the expressions (11) and (12), nanoparticles of which particle size φ is not greater than 5 nm and of which interparticle distance d is not greater than 2 nm can be formed.

A region surrounded by lines L1 and L3 corresponds to a range of the composition of Au and the composition ratio Si/Ge where particle size φ satisfies a condition of φ≤3 nm and ratio of crystallization η satisfies a condition of η≥16%. The composition of Au and the composition ratio Si/Ge included in the range satisfy the relational expressions in the expressions (11) and (13). In other words, as the composition of Au and the composition ratio Si/Ge satisfy the relational expressions in the expressions (11) and (13), nanoparticles of which particle size φ is not greater than 3 nm and of which interparticle distance d is not greater than 2 nm can be formed.

Second Embodiment

5. Control of Carrier Confinement Effect

As a result of studies about control of a composition of Au and a composition ratio Si/Ge in the thermoelectric material in the thermoelectric material in which SiGe nanoparticles containing Au are distributed in the base material composed of Si and Ge, the present inventor has found that the carrier confinement effect in quantum dots is varied by the composition ratio Si/Ge. A result of studies about an optimal composition ratio Si/Ge at which the carrier confinement effect can be exhibited based on the finding will be described in a second embodiment.

Figure 15:
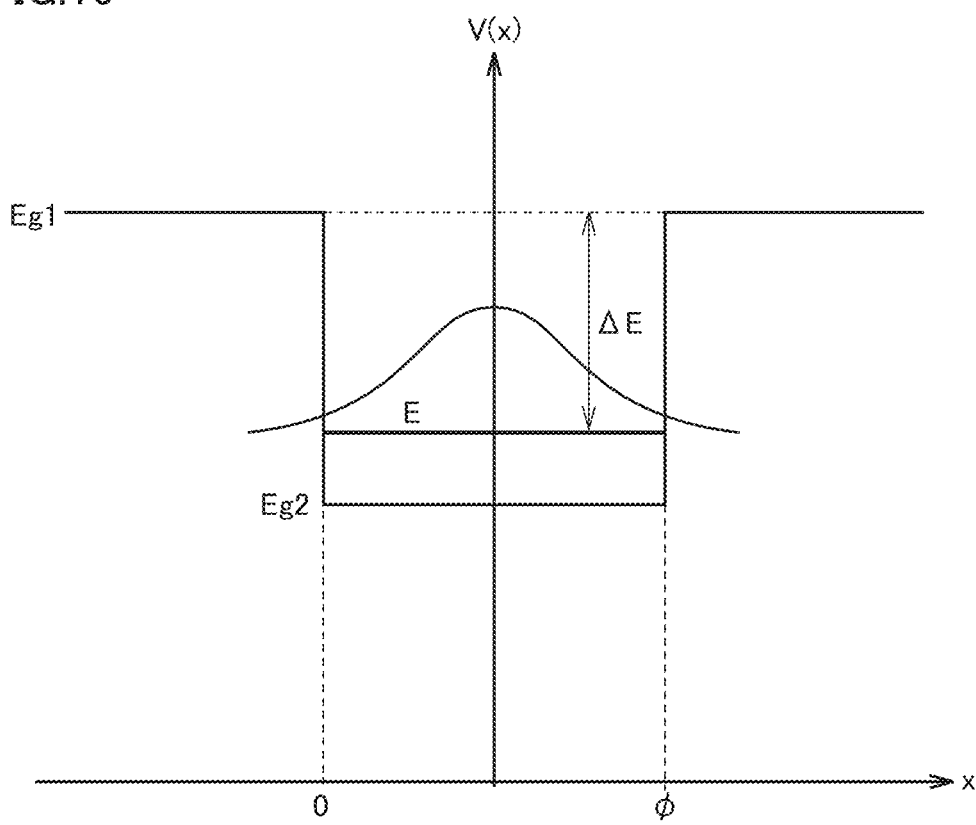
FIG. 15 is a diagram schematically showing an energy band structure of a quantum dot.

FIG. 15 is a diagram schematically showing an energy band structure of a quantum dot (nanoparticle). As shown in FIG. 15, a base material having a band gap Eg1 and nanoparticles having a band gap Eg2 smaller than band gap Eg1 are alternately arranged so that a three-dimensional finite well potential is formed in the energy band.

In FIG. 15, a width of the well potential corresponds to particle size φ of a nanoparticle. A quantum level E is formed in the well potential. Quantum level E can be found by subjecting the three-dimensional finite well potential of which potential barrier height is (Eg1−Eg2) to numerical calculation of the Schrödinger equation for particles in the potential.

A composition ratio between Si and Ge in the thermoelectric material is defined as 1−x:x (0≤x≤1). Then, the composition ratio Si/Ge in each of single-crystal SiGe which is a nanoparticle and amorphous SiGe which is a base material is expressed as (1−x)/x.

Figure 16:
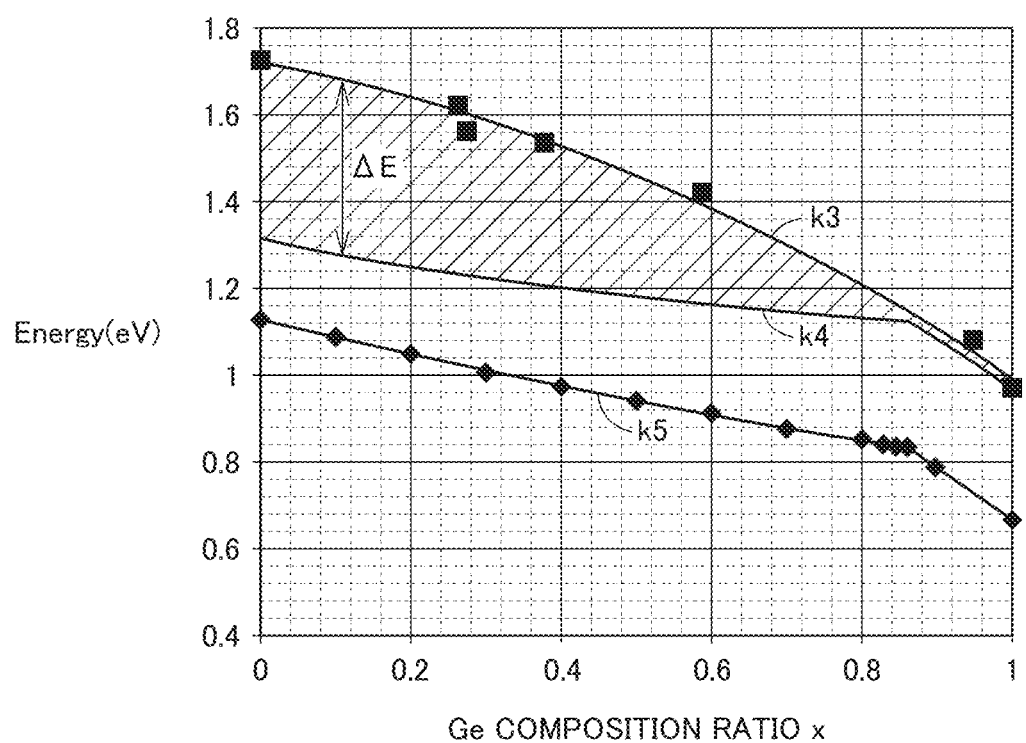
FIG. 16 is a diagram showing dependency on a Ge composition ratio x of a band gap of SiGe.

FIG. 16 is a diagram showing dependency on a Ge composition ratio x of a band gap of SiGe. The ordinate in FIG. 16 represents energy (eV) and the abscissa represents Ge composition ratio x. In the figure, k3 represents dependency on Ge composition ratio x of a band gap of amorphous SiGe representing the base material. In the figure, k5 represents dependency on Ge composition ratio x of a band gap of single-crystal SiGe representing a nanoparticle.

As shown in FIG. 16, the band gap of amorphous SiGe is smaller with increase in Ge composition ratio x. The band gap of amorphous SiGe corresponds to band gap Eg1 of the base material shown in FIG. 12. With increase in Ge composition ratio x, band gap Eg1 is smaller.

The band gap of single-crystal SiGe is also smaller with increase in Ge composition ratio x. The band gap of single-crystal SiGe has a band structure similar to that of Si when Ge composition ratio x satisfies a condition of $0 \leq x \leq 0.86$, and has a band structure similar to that of Ge when a condition of $x > 0.86$ is satisfied. The band gap of single-crystal SiGe corresponds to band gap Eg2 of the nanoparticle shown in FIG. 12. Band gap Eg2 is smaller with increase in Ge composition ratio x.

In FIG. 16, k4 represents dependency on Ge composition ratio x of quantum level E shown in FIG. 15. Quantum level E is calculated by solving the Schrödinger equation for a bound state $(V(x) \leq (Eg1-Eg2))$ for each Ge composition ratio x, with a nanoparticle being defined to have particle size $\phi=2.5$ nm corresponding to the width of the three-dimensional finite well potential.

Referring to FIG. 16, as each of band gaps Eg1 and Eg2 is varied as a function of Ge composition ratio x in the quantum dot shown in FIG. 12, quantum level E is also varied as a function of Ge composition ratio x. Specifically, quantum level E lowers more gently than the band gaps of both of amorphous SiGe and single-crystal SiGe when Ge composition ratio x satisfies the condition of $0 \leq x \leq 0.86$. When Ge composition ratio x is higher than 0.86, quantum level E has a value proximate to band gap Eg1.

FIG. 16 shows with $\Delta E$, an energy difference between band gap Eg1 of the base material and quantum level E. Energy difference $\Delta E$ can suppress carriers at the quantum level going beyond the potential barrier between the nanoparticles and the base material. Therefore, greater energy difference $\Delta E$ leads to a more noticeable carrier confinement effect.

Figure 17:
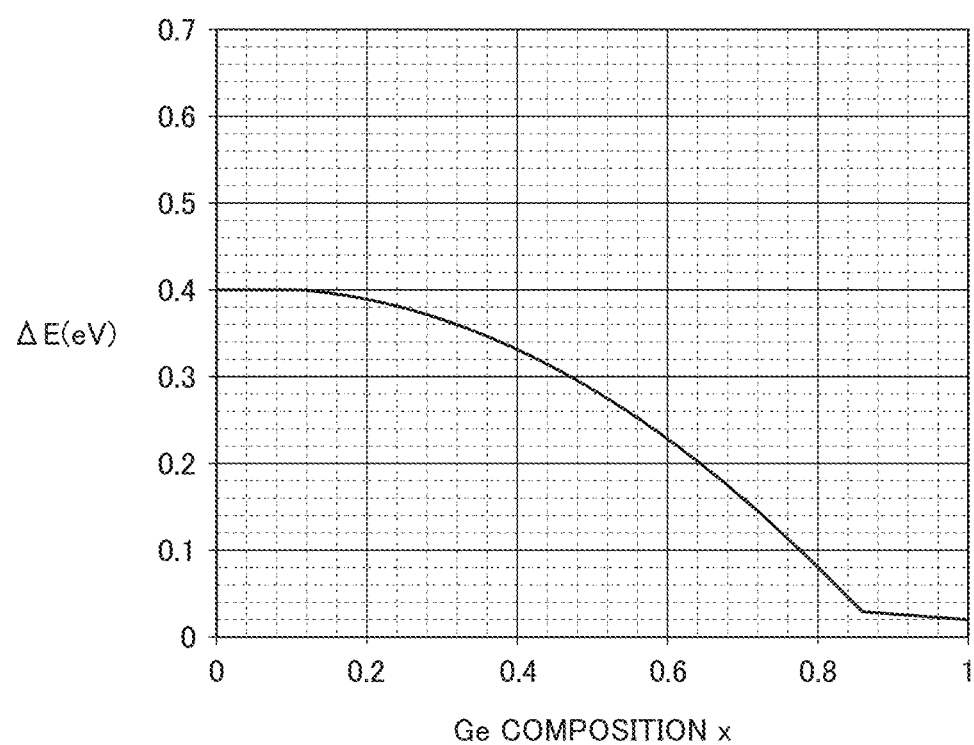
FIG. 17 shows with a numeric value, dependency on Ge composition ratio x of an energy difference ΔE shown in FIG. 16.

A region shown with hatching in FIG. 16 represents dependency on Ge composition ratio x of energy difference $\Delta E$. A width of this region in a vertical direction is equivalent to energy difference $\Delta E$ at each Ge composition ratio x. As can be seen in FIG. 16, a width of the region in a direction of the ordinate is restricted with increase in Ge composition ratio x. In particular, when Ge composition ratio x is higher than 0.86, the width of the region in the vertical direction is significantly restricted. FIG. 17 shows with a numeric value, dependency on Ge composition ratio x of energy difference $\Delta E$ shown in FIG. 16. The ordinate in FIG. 17 represents energy (eV) and the abscissa represents Ge composition ratio x.

Referring to FIG. 17, energy difference $\Delta E$ is smaller with increase in Ge composition ratio x. It can thus be seen that the carrier confinement effect is lower with increase in Ge composition ratio x. In particular, when Ge composition ratio x exceeds 0.86, energy difference $\Delta E$ is approximately 0.03 eV. This energy difference $\Delta E$ is equivalent to energy of carriers. Therefore, it is expected that carriers can no longer be confined in the quantum dot when the Ge composition ratio exceeds 0.86.

It can thus be seen from dependency on Ge composition ratio x of energy difference $\Delta E$ shown in FIG. 17 that energy difference $\Delta E$ has a threshold value attributed to Ge composition ratio x. When Ge composition ratio x is higher than 0.86, energy difference $\Delta E$ remains at approximately 0.03 eV. When Ge composition ratio x is not higher than 0.86, energy difference $\Delta E$ is not lower than 0.03 eV and is considerably varied in accordance with Ge composition ratio x.

The present inventor has found from the results in FIG. 17 that Ge composition ratio $x=0.86$ corresponds to the threshold value for energy difference $\Delta E$. Then, the present inventor has found that Ge composition ratio x is preferably not higher than 0.86 in order to produce the carrier confinement effect. Setting Ge composition ratio x to 0.86 or lower means that the composition ratio Si/Ge is set to 0.16 or higher. In order to express the carrier confinement effect, the composition ratio Si/Ge is preferably not lower than 0.16.

The present inventor has further studied based on the finding, energy difference $\Delta E$ optimal for producing a sufficient carrier confinement effect. In these studies, Seebeck coefficient S is calculated for each energy difference $\Delta E$, and by using calculated Seebeck coefficient S, thermoelectric characteristics (dimensionless performance index ZT) of the thermoelectric material are calculated. In calculation, conductivity $\sigma$ is set to $3 \times 10^3$ (S/m) and the expressions (3), (4), and (5) are used. Consequently, when energy difference $\Delta E$ is 0.1 eV, Seebeck coefficient S is calculated as $1 \times 10^{-3}$ (V/K). Dimensionless performance index ZT here is calculated as approximately $1 \times 10$. Relation between conductivity $\sigma$ and dimensionless performance index ZT is proximate to the theoretic lines representing thermoelectric characteristics in the quantum net structure shown in FIG. 5, which represents good thermoelectric characteristics. The present inventor has thus found that energy difference $\Delta E$ is preferably not lower than 0.1 eV in order to achieve good thermoelectric characteristics.

When energy difference $\Delta E$ is 0.2 eV, Seebeck coefficient S increases to $2 \times 10^{-3}$ (V/K), and hence it is estimated that thermoelectric characteristics can further be improved. It is estimated, however, that Seebeck coefficient S when energy difference $\Delta E$ is 0.3 eV is equivalent in value to Seebeck coefficient S when energy difference $\Delta E$ is 0.2 eV and hence the carrier confinement effect is saturated. Therefore, it can be concluded that in order to exhibit the sufficient carrier confinement effect, energy difference $\Delta E$ is preferably not lower than 0.1 eV and further preferably not lower than 0.2 eV.

It can be seen from dependency on Ge composition ratio x of energy difference $\Delta E$ shown in FIG. 17 that Ge composition ratio x should only be not higher than 0.77 in order to achieve energy difference $\Delta E$ not lower than 0.1 eV. Setting Ge composition ratio x to 0.77 or lower means setting the composition ratio Si/Ge to 0.3 or higher.

It can be seen that Ge composition ratio x should only be not higher than 0.64 in order to achieve energy difference $\Delta E$ not lower than 0.2 eV. Setting Ge composition ratio x to 0.64 or lower means setting the composition ratio Si/Ge to 0.56 or higher.

According to dependency on Ge composition ratio x of energy difference $\Delta E$ shown in FIG. 17, in order to exhibit the sufficient carrier confinement effect, Ge composition ratio x is preferably not higher than 0.77 and more preferably not higher than 0.64. In order to obtain such Ge composition ratio x, the composition ratio Si/Ge is preferably not lower than 0.3 and further preferably not lower than 0.56.

Figure 18:
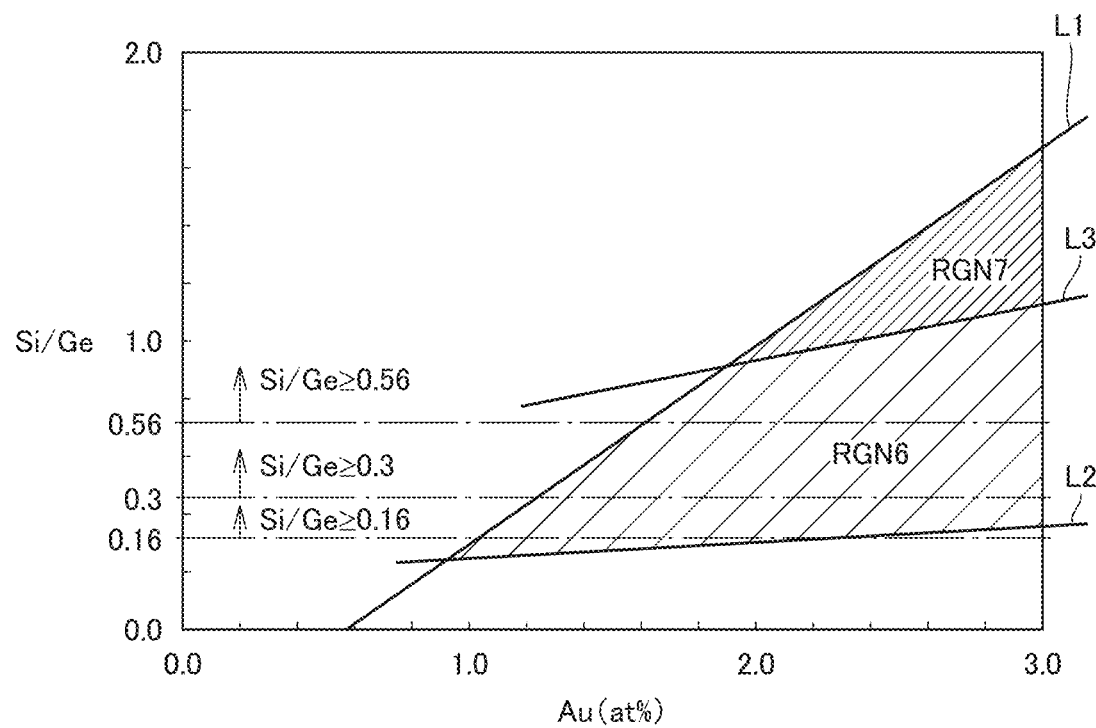
FIG. 18 is a diagram obtained by superimposing a range of the composition ratio Si/Ge obtained in a second embodiment on a range of the composition of Au and the composition ratio Si/Ge obtained in a first embodiment.

FIG. 18 is obtained by superimposing a range of the composition ratio Si/Ge obtained in the present embodiment on a range of the composition of Au and the composition ratio Si/Ge obtained in the first embodiment.

According to FIG. 18, by setting a composition ratio Si/Ge to be not lower than 0.16 in the range of the composition of Au and the composition ratio Si/Ge shown with the region surrounded by lines L1 and L2 (regions RGN6 and RGN7), the carrier confinement effect can be expressed in the quantum net structure in which nanoparticles having particle size $\phi$ not greater than 5 nm are distributed at interparticle distance d not greater than 2 nm.

In order to exhibit the sufficient carrier confinement effect, in that range, the composition ratio Si/Ge is preferably not lower than 0.3 and more preferably not lower than 0.56.

Third Embodiment

The thermoelectric material according to a third embodiment is different from the thermoelectric material according to the first embodiment only in using a substrate body 48 instead of sapphire substrate 40.

Figure 19:
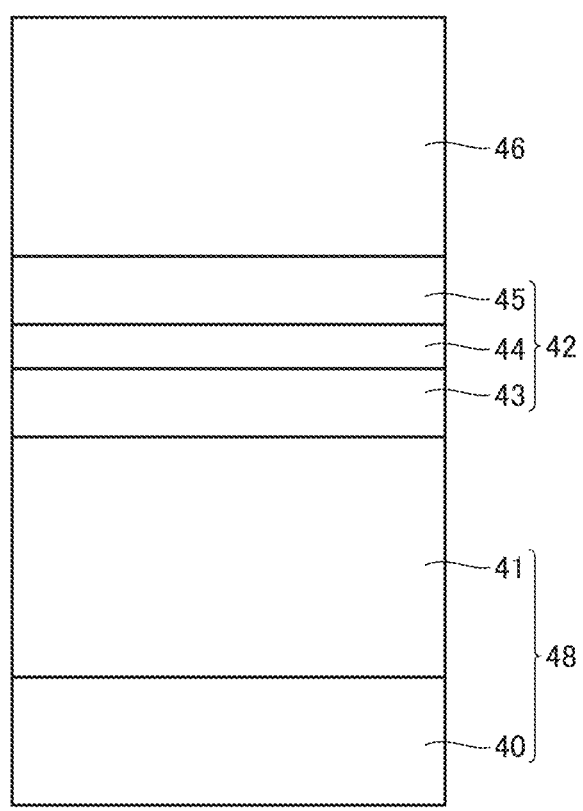
FIG. 19 is a cross-sectional view schematically showing a stack in a state after a stacking step which was performed once and before annealing treatment in the third embodiment.

FIG. 19 is a cross-sectional view schematically showing a stack in a state after the stacking step which was performed once and before annealing treatment. Substrate body 48 is constituted of sapphire substrate 40 and an uppermost layer 41 formed from an amorphous Si (a-Si) layer. In substrate body 48, initially, sapphire substrate 40 is prepared and uppermost layer 41 is formed thereon by depositing Si with MBE or EB. Since other steps are the same as in the first embodiment, description thereof will not be provided. In a stack containing nanoparticles which is manufactured according to the present embodiment, Au representing the different element is diffused in uppermost layer 41.

In the third embodiment, the stacking step is a step of alternately stacking first layer 42 and second layer 46 on substrate body 48. Such a substrate body 48 is preferably formed in such a manner that uppermost layer 41 in contact with first layer 42 or second layer 46 is formed of a material capable of forming a solid solution of the different element.

With such a construction, in diffusion of the different element through annealing treatment, the different element can diffuse also in substrate body 48 and precipitation of the different element as being concentrated in a specific portion, in particular, in a portion of first layer 42 in contact with substrate body 48, can be prevented. When the different element is precipitated as being concentrated in a specific portion, such a specific portion may form a leak path, which hence may be a cause for lowering in thermoelectric characteristics when the stack containing nanoparticles manufactured with the manufacturing method according to the present embodiment is used as the thermoelectric material.

Lowering in thermoelectric characteristics due to such a leak path tends to be noticeable when a temperature difference caused in the thermoelectric material is great, for example, when a temperature difference is more than 1 K. Therefore, even a substrate body not having an uppermost layer can obtain sufficient thermoelectric characteristics. In particular when a temperature difference caused in the thermoelectric material is small, for example, not more than 1 K, sufficient thermoelectric characteristics can be obtained even by a substrate body not having an uppermost layer.

A material forming uppermost layer 41 is not limited so long as a material can form a solid solution of a different element contained in first layer 42 under a treatment condition for the annealing step, and examples of such a material include Si, a semiconductor, glass, ceramics, and an organic substance such as poly(3,4-ethylenedioxythiophene) (PEDOT). Examples of glass include amorphous glass and porous glass.

A material low in rate of diffusion of a different element is more preferred as a material forming uppermost layer 41, because a material lower in rate of diffusion of a different element facilitates control of diffusion of the different element in uppermost layer 41. For example, when Au is employed as a different element, one example of a material which can form a solid solution of Au includes Si and Ge. Of these, Si is lower in rate of diffusion of Au, and hence Si is more preferably used to form uppermost layer 41. A rate of diffusion of a different element in a material is expected to correlate with affinity between a material and the different element and with a melting point of a material containing the different element.

Substrate body 48 may be a stack of uppermost layer 41 and other layers or a single-layered body consisting of uppermost layer 41. In a case of a stack, for example, a stack in which uppermost layer 41 is formed on a substrate can be employed. Though a thickness of uppermost layer 41 is not limited so long as precipitation of a different element as being concentrated in a specific portion of first layer 42 can be prevented, the thickness is preferably not smaller than 5 nm and further preferably not smaller than 15 nm. With the thickness not smaller than 5 nm, a different element which diffuses under a treatment condition in the annealing step can sufficiently be contained. Though an upper limit value is not particularly limited, it can be, for example, not greater than 300 nm from a point of view of cost.

Fourth Embodiment

A construction of a thermoelectric element and a thermoelectric module formed with the thermoelectric material according to the first to third embodiments described above will be described in a fourth embodiment.

Figure 20A:
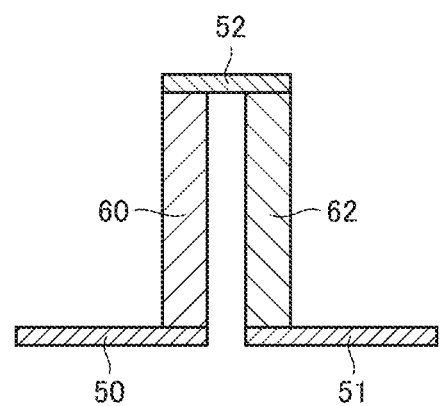
FIG. 20A is a cross-sectional view schematically showing a construction of a thermoelectric element according to a fourth embodiment.
Figure 20B:
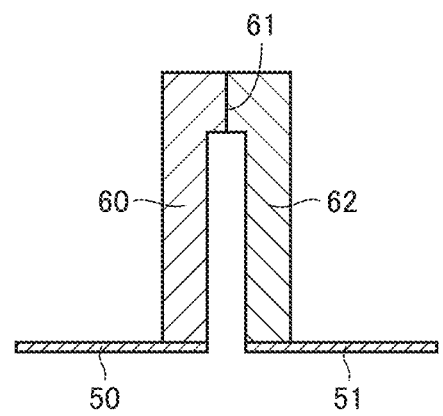
FIG. 20B is a cross-sectional view schematically showing a construction of a thermoelectric element according to the fourth embodiment.

FIGS. 20A and 20B are cross-sectional views schematically showing a construction of a thermoelectric element according to the fourth embodiment. Referring to FIG. 20A, the thermoelectric element includes a p-type thermoelectric material 60, an n-type thermoelectric material 62, low-temperature side electrodes 50 and 51, and a high-temperature side electrode 52. P-type thermoelectric material 60 is formed by doping the thermoelectric material according to the first and second embodiments described above with a p-type impurity. For example, when a thermoelectric material is composed of SiGe, p-type thermoelectric material 60 is doped with B. N-type thermoelectric material 62 is formed by doping the thermoelectric material according to the first and second embodiments described above with an n-type impurity. For example, when a thermoelectric material is composed of SiGe, n-type thermoelectric material 62 is doped with P. P-type thermoelectric material 60 and n-type thermoelectric material 62 are defined as the "first thermoelectric material" and the "second thermoelectric material," respectively. Each of p-type thermoelectric material 60 and n-type thermoelectric material 62 has a first end surface and a second end surface opposed to the first end surface.

High-temperature side electrode 52 is joined to the first end surface of p-type thermoelectric material 60 and the first end surface of n-type thermoelectric material 62. Low-temperature side electrode 50 is joined to the second end surface of p-type thermoelectric material 60. Low-temperature side electrode 51 is joined to the second end surface of n-type thermoelectric material 62. A thermoelectric element obtained by combining p-type thermoelectric material 60 and n-type thermoelectric material 62 in series as above is referred to as a π-structure thermoelectric element. When a temperature difference is applied across high-temperature side electrode 52 and low-temperature side electrodes 50 and 51 in the π-structure thermoelectric element, thermal energy is converted to electric energy owing to the Seebeck effect, and thus a voltage is generated between low-temperature side electrodes 50 and 51.

The π-structure thermoelectric element may be constructed such that p-type thermoelectric material 60 and n-type thermoelectric material 62 are directly joined to each other without high-temperature side electrode 52 being interposed as shown in FIG. 20B. Specifically, each of p-type thermoelectric material 60 and n-type thermoelectric material 62 has the first end surface and the second end surface opposite to the first end surface. P-type thermoelectric material 60 and n-type thermoelectric material 62 have the first end surfaces joined to each other at a joint portion 61. Low-temperature side electrode 50 is connected to the second end surface of p-type thermoelectric material 60 and low-temperature side electrode 51 is connected to the second end surface of n-type thermoelectric material 62. A voltage in accordance with a temperature difference between joint portion 61 between p-type thermoelectric material 60 and n-type thermoelectric material 62 and low-temperature side electrodes 50 and 51 is generated.

Figure 21:
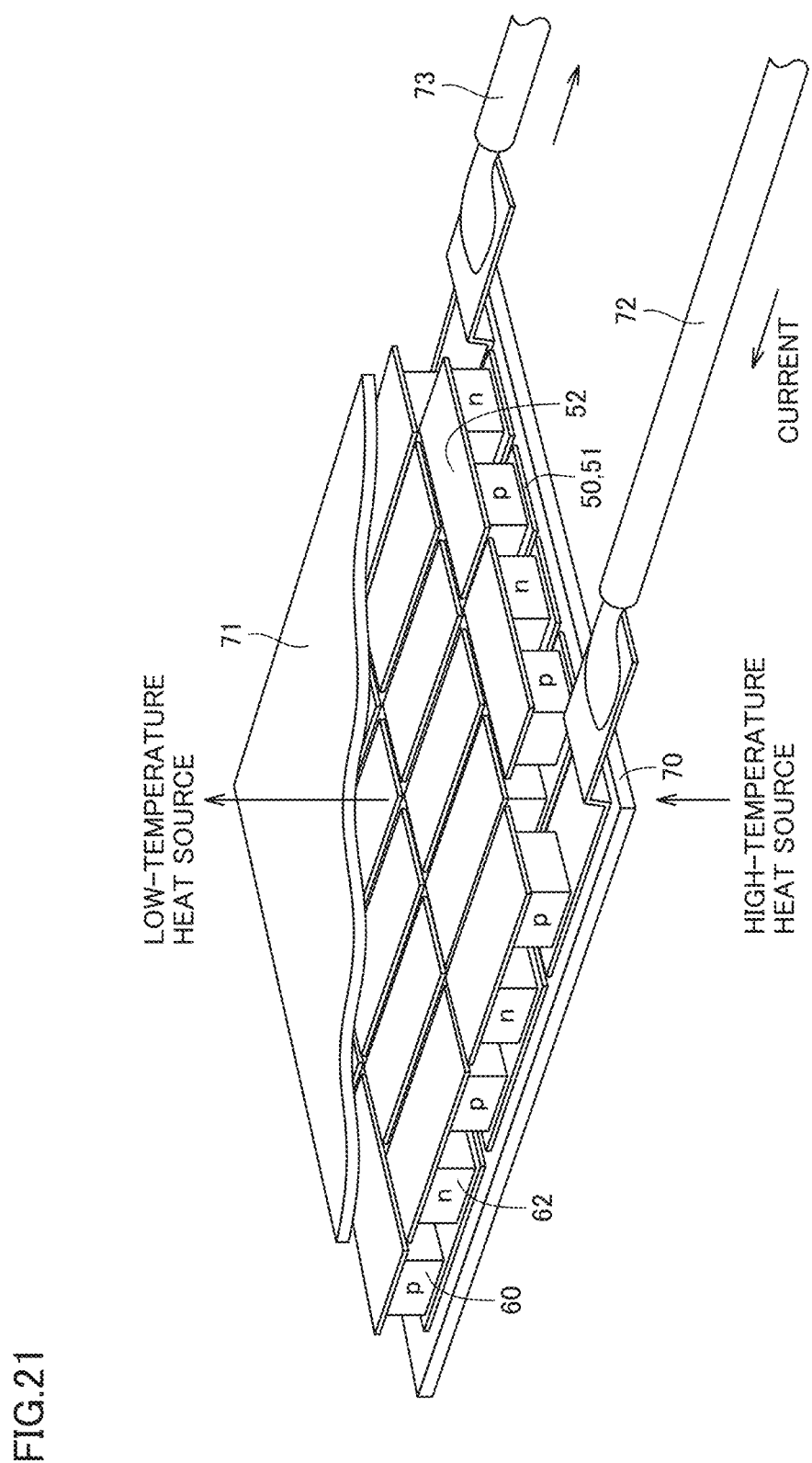
FIG. 21 is a partially cut-away perspective view showing a construction example of a thermoelectric module.

By connecting a plurality of π-structure thermoelectric elements in series, a thermoelectric module as shown in FIG. 21 can be formed. The thermoelectric module achieves high conversion efficiency by applying the thermoelectric material having good thermoelectric characteristics. FIG. 21 is a partially cut-away perspective view showing a construction example of the thermoelectric module.

Referring to FIG. 21, the thermoelectric module is constructed by joining p-type thermoelectric material 60 and n-type thermoelectric material 62 by alternately electrically connecting the p-type thermoelectric material and the n-type thermoelectric material in series, between a pair of insulator substrates 70 and 71. Performance of the thermoelectric module can be adjusted by performance, a size, and the number of pairs to be incorporated (the number of pairs), of p-type thermoelectric material 60 and n-type thermoelectric material 62.

A pair of insulator substrates 70 and 71 is formed, for example, of alumina or ceramics. An electrode pattern is formed on an upper surface of lower insulator substrate 70 with such a method as plating. A pair of p-type thermoelectric material 60 and n-type thermoelectric material 62 is mounted on an upper surface of each independent electrode pattern, with solder being interposed.

A similar electrode pattern is formed also on a lower surface of upper insulator substrate 71, and an upper electrode pattern is arranged as being relatively displaced from a lower electrode pattern. Consequently, a plurality of p-type thermoelectric materials 60 and n-type thermoelectric materials 62 joined between a plurality of lower electrode patterns and a plurality of upper electrode patterns with solder being interposed are alternately electrically connected in series.

On lower insulator substrate 70, in order to supply electric power to the thermoelectric module, an electrode pattern connected to one p-type thermoelectric material 60 and an electrode pattern connected to one n-type thermoelectric material 62 are paired and at least one such pair is connected in series or in parallel, and one lead 72 is attached to an electrode material connected to at least one p-type thermoelectric material with solder and one lead 73 is attached to an electrode material connected to at least one n-type thermoelectric material with solder.

Figure 22:
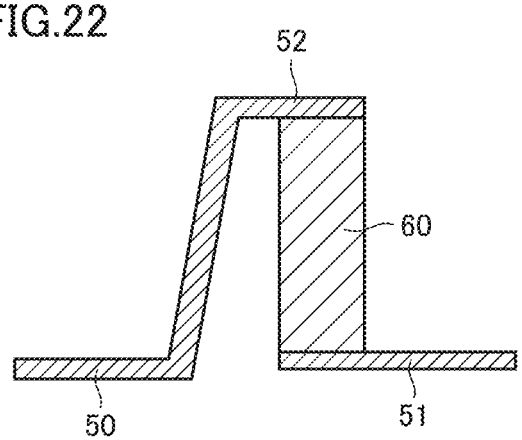
FIG. 22 is a cross-sectional view schematically showing another construction of a thermoelectric element according to the fourth embodiment.

The thermoelectric element according to the present embodiment is not limited to the π-structure thermoelectric element as above, and may be implemented only with p-type thermoelectric material 60 as shown in FIG. 22. FIG. 22 is a cross-sectional view schematically showing another construction of a thermoelectric element according to the fourth embodiment. Referring to FIG. 20, the thermoelectric element includes p-type thermoelectric material 60, high-temperature side electrode 52, and low-temperature side electrode 51. P-type thermoelectric material 60 is formed by doping the thermoelectric material according to the first to third embodiments described above with a p-type impurity. For example, when a thermoelectric material is composed of SiGe, p-type thermoelectric material 60 is doped with B.

High-temperature side electrode 52 is joined to the first end surface of p-type thermoelectric material 60, and low-temperature side electrode 51 is joined to the second end surface of p-type thermoelectric material 60. Such a thermoelectric element including only p-type thermoelectric material 60 is referred to as a uni-leg thermoelectric element. The uni-leg thermoelectric element may be implemented only with an n-type thermoelectric material. By connecting a plurality of uni-leg thermoelectric elements in series, a thermoelectric module as shown in FIG. 21 can be formed.

Fifth Embodiment

A construction of an optical sensor formed of the thermoelectric material according to the first to third embodiments described above will be described in a fifth embodiment.

Figure 23:
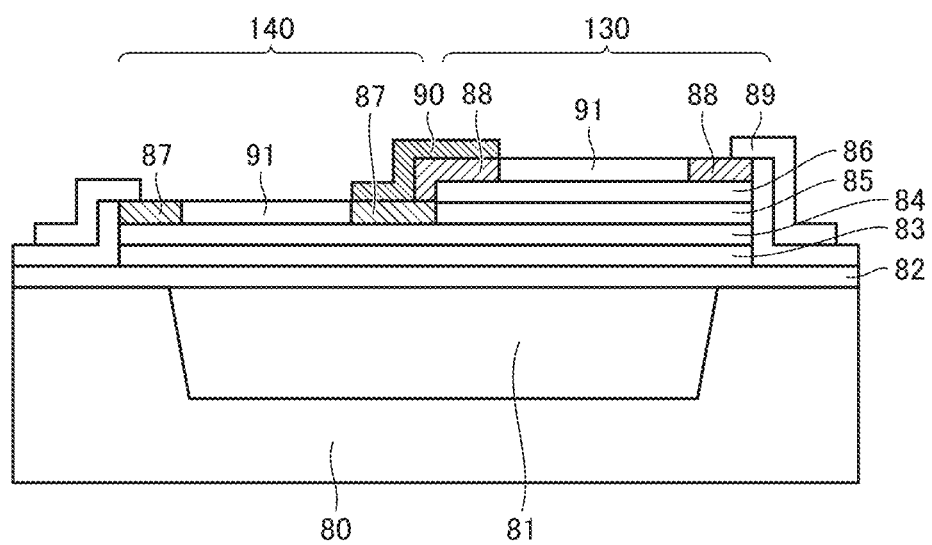
FIG. 23 is a cross-sectional view of an optical sensor according to a fifth embodiment.

FIG. 23 is a cross-sectional view of an optical sensor according to the fifth embodiment. Referring to FIG. 23, the optical sensor includes a p-type thermoelectric conversion portion 130 and an n-type thermoelectric conversion portion 140 which are formed on a substrate 80 composed of $SiO_2$.

On substrate 80, an etching stop layer 82 composed on SiN, an n-type thermoelectric material 83, an $n^+$ type ohmic contact layer 84, an insulator layer 85 composed of $SiO_2$, and a p-type thermoelectric material 86 are successively stacked. N-type thermoelectric material 83 is formed by doping the thermoelectric material according to the first to third embodiments described above with an n-type impurity. For example, when the thermoelectric material is composed of SiGe, n-type thermoelectric material 83 is doped with P. P-type thermoelectric material 86 is formed by doping the thermoelectric material according to the first to third embodiments described above with a p-type impurity. For example, when the thermoelectric material is composed of SiGe, p-type thermoelectric material 86 is doped with B.

In p-type thermoelectric conversion portion 130, a p-type ohmic contact layer 88 is formed on p-type thermoelectric material 86 on opposing sides. Si doped with B is used for p-type ohmic contact layer 88. A protection film 91 is formed on p-type thermoelectric material 86 between p-type ohmic contact layers 88. In n-type thermoelectric conversion portion 140, p-type thermoelectric material 86 and insulator layer 85 are removed, and an n-type ohmic contact layer 87 is formed on n-type thermoelectric material 83 on opposing sides. Protection film 91 composed of $SiO_2$ is formed above n-type thermoelectric material 83 between n-type ohmic contact layers 87. Si doped with P is used for n-type ohmic contact layer 87 and $n^+$ type ohmic contact layer 84.

An absorber 90 is provided on p-type ohmic contact layer 88 and n-type ohmic contact layer 87 on a side where p-type thermoelectric conversion portion 130 and n-type thermoelectric conversion portion 140 are in contact with each other. A heat absorption pad 89 is provided on the other p-type ohmic contact layer 88 and the other n-type ohmic contact layer 87. Titanium (Ti) is used for absorber 90 and Au/Ti is used for heat absorption pad 89. A cavity 81 is provided in substrate 80 under p-type thermoelectric conversion portion 130 and n-type thermoelectric conversion portion 140.

P-type thermoelectric conversion portion 130 and n-type thermoelectric conversion portion 140 shown in FIG. 23 can be manufactured, for example, in accordance with a method shown below. Initially, etching stop layer 82 is formed on substrate 80 with plasma CVD. For example, an insulator composed of SiN or the like having a film thickness of 0.5 μm is deposited with CVD at 400° C. Then, n-type thermoelectric material 83, $n^+$ type ohmic contact layer 84, insulator layer 85, and p-type thermoelectric material 86 are stacked on etching stop layer 82 with EB. This thin film material is subjected to annealing treatment for 15 minutes at a temperature of 600° C. in a nitrogen ($N_2$) atmosphere. Nanoparticles are thus formed in a base material in n-type thermoelectric material 83 and p-type thermoelectric material 86.

Then, p-type ohmic contact layer 88 in a prescribed portion is removed by etching (for example, dry etching with CF4) after a resist film is formed in the prescribed portion on a surface of the thin film material with photolithography. P-type thermoelectric material 86 and insulator layer 85 in a region to be n-type thermoelectric conversion portion 140 are removed by etching with a resist film being formed again on a prescribed portion.

Then, absorber 90 and heat absorption pad 89 are formed with vapor deposition with a resist technique and a lift-off technique as being combined. Thereafter, cavity 81 is provided by etching (for example, dry etching with CF4) substrate 80 under etching stop layer 82, with a prescribed portion being masked.

As the optical sensor is irradiated with light (including far-infrared light), absorber 90 arranged in the center absorbs light and a temperature thereof increases. Owing to a temperature difference between absorber 90 and heat absorption pad 89, thermoelectric conversion owing to the Seebeck effect by p-type thermoelectric conversion portion 130 and n-type thermoelectric conversion portion 140 is carried out. Thus, in p-type thermoelectric conversion portion 130, electromotive force is produced between p-type ohmic contact layers 88. In n-type thermoelectric conversion portion 140, electromotive force is produced between n-type ohmic contact layers 87. Light can thus be sensed.

Though the optical sensor includes p-type thermoelectric conversion portion 130 and n-type thermoelectric conversion portion 140 in FIG. 23, similar effects can be achieved by an optical sensor including any one of p-type thermoelectric conversion portion 130 and n-type thermoelectric conversion portion 140.

It should be understood that the embodiments disclosed herein are illustrative and non-restrictive in every respect. The scope of the present invention is defined by the terms of the claims rather than the embodiments above and is intended to include any modifications within the scope and meaning equivalent to the terms of the claims.

REFERENCE SIGNS LIST

1 to 3, RGN1 to RGN7 region; 10 thermoelectric material; 20 base material; 30 quantum dot (nanoparticle); 32 wave function; 40 sapphire substrate; 41 uppermost layer; 42 first layer; 43, 45 amorphous Ge layer; 44 Au layer; 46 second layer; 48 substrate body; 50, 51 low-temperature type electrode; 52 high-temperature side electrode; 60, 86 p-type thermoelectric material; 61 joint portion; 62, 83 n-type thermoelectric material; 70, 71 insulator substrate; 73 lead; 80 substrate; 81 cavity; 82 etching stop layer; 84 $n^+$ type ohmic contact layer; 85 insulator layer; 88 p-type ohmic contact layer; 89 heat absorption pad; 90 absorber; 91 protection film; 130 p-type thermoelectric conversion portion; and 140 n-type thermoelectric conversion portion

The invention claimed is:

1. A thermoelectric material comprising:
a plurality of nanoparticles distributed in a mixture of a first material and a second material,
the first material containing Si and Ge,
the second material being different from the first material,
a concentration of atoms of the second material and a composition ratio of Si to Ge satisfying relational expressions in expressions (1) and (2) below with c representing a concentration of atoms (unit of atomic %) of the second material and r representing the composition ratio of Si to Ge in the thermoelectric material:

$$r \leq 0.62c - 0.25 \quad (1)$$

$$r \geq 0.05c - 0.06 \quad (2).$$

2. The thermoelectric material according to claim 1, wherein
the concentration of atoms of the second material and the composition ratio further satisfy a relational expression in an expression (3) below:

$$r \geq 0.23c + 0.3 \quad (3).$$

3. The thermoelectric material according to claim 1, wherein
the composition ratio is not lower than 0.16.

4. The thermoelectric material according to claim 3, wherein
the composition ratio is not lower than 0.3.

5. The thermoelectric material according to claim 4, wherein
the composition ratio is not lower than 0.56.

6. The thermoelectric material according to claim 1, wherein
the second material is defined as Au, Cu, B, or Al.

7. A thermoelectric element comprising:
the thermoelectric material according to claim 1, the thermoelectric material being doped to a p-type or an n-type; and
a pair of electrodes joined to a first end surface of the thermoelectric material and a second end surface opposed to the first end surface, respectively.

8. A thermoelectric element comprising:
the thermoelectric material according to claim 1, the thermoelectric material being doped to a p-type or an n-type; and
a pair of electrodes arranged such that the electrodes are spaced apart from each other on an identical main surface of the thermoelectric material and joined to the thermoelectric material.

9. A thermoelectric element comprising:
a first thermoelectric material doped to a p-type;
a second thermoelectric material doped to an n-type, the first thermoelectric material and the second thermoelectric material being composed of the thermoelectric material according to claim 1, the first thermoelectric material and the second thermoelectric material each having a first end surface and a second end surface located opposite to the first end surface, the first thermoelectric material and the second thermoelectric material being joined to each other at the first end surfaces; and
a pair of electrodes joined to the second end surface of the first thermoelectric material and the second end surface of the second thermoelectric material, respectively.

10. An optical sensor comprising:
an absorber which absorbs light and converts light to heat; and
a thermoelectric conversion portion connected to the absorber,
the thermoelectric conversion portion including the thermoelectric material according to claim 1, the thermoelectric material being doped to a p-type or an n-type.

11. A method of manufacturing a thermoelectric material including a plurality of nanoparticles distributed in a mixture of a first material and a second material, the first material containing Si and Ge, the second material being different from the first material, the method comprising:
alternately stacking a first layer containing Ge and the second material and a second layer containing Si and not containing the second material,
a concentration of atoms of the second material and a composition ratio of Si to Ge satisfying relational expressions in expressions (1) and (2) below with c representing a concentration of atoms (unit of atomic %) of the second material and r representing the composition ratio of Si to Ge in the thermoelectric material:

$$r \leq 0.62c - 0.25 \quad (1)$$

$$r \geq 0.05c - 0.06 \quad (2).$$

12. The method according to claim 11, further comprising forming the plurality of nanoparticles in the mixture by annealing a stack obtained by stacking the first layer and the second layer.

13. The method according to claim 12, wherein
a temperature for annealing is not lower than 300° C. and not higher than 800° C.

14. The thermoelectric material according to claim 2, wherein the composition ratio is not lower than 0.16.

15. The thermoelectric material according to claim 6, wherein the composition ratio is not lower than 0.3.

16. The thermoelectric material according to claim 7, wherein the composition ratio is not lower than 0.56.

* * * * *